(12) United States Patent
Jain et al.

(10) Patent No.: US 11,410,921 B2
(45) Date of Patent: Aug. 9, 2022

(54) METHODS TO INCORPORATE THIN FILM CAPACITOR SHEETS (TFC-S) IN THE BUILD-UP FILMS

(71) Applicant: Intel Corporation, Santa Clara, CA (US)

(72) Inventors: Rahul Jain, Gilbert, AZ (US); Kyu Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 841 days.

(21) Appl. No.: 16/107,920

(22) Filed: Aug. 21, 2018

(65) Prior Publication Data
US 2020/0066622 A1 Feb. 27, 2020

(51) Int. Cl.
| | |
|---|---|
| H01L 23/498 | (2006.01) |
| H01G 4/33 | (2006.01) |
| H01L 21/48 | (2006.01) |
| H01G 4/228 | (2006.01) |

(52) U.S. Cl.
CPC ....... H01L 23/49822 (2013.01); H01G 4/228 (2013.01); H01G 4/33 (2013.01); H01L 21/481 (2013.01); H01L 21/486 (2013.01); H01L 21/4857 (2013.01); H01L 23/49838 (2013.01)

(58) Field of Classification Search
CPC ......... H01L 23/49822; H01L 23/49838; H01L 21/481; H01L 21/4857; H01L 21/486; H01G 4/228; H01G 4/33
USPC .......................................................... 257/774
See application file for complete search history.

(56) References Cited

U.S. PATENT DOCUMENTS

| | | | | |
|---|---|---|---|---|
| 2008/0142253 A1* | 6/2008 | Salama | ................ | H05K 1/162 174/258 |
| 2009/0200638 A1* | 8/2009 | Smith | ............... | H01L 21/76816 257/532 |
| 2015/0195905 A1* | 7/2015 | Kang | ................ | H01L 23/49894 427/79 |
| 2016/0064391 A1* | 3/2016 | Li | ..................... | H01L 27/10897 257/295 |
| 2016/0088736 A1* | 3/2016 | Sankman | ............ | H05K 3/0017 361/748 |
| 2018/0098428 A1* | 4/2018 | Hua | ..................... | H01L 21/486 |
| 2019/0008046 A1* | 1/2019 | Aleksov | ........... | H01L 23/49894 |
| 2020/0006258 A1* | 1/2020 | Aleksov | ................. | H01L 28/40 |

\* cited by examiner

*Primary Examiner* — David Vu
*Assistant Examiner* — Brandon C Fox
(74) *Attorney, Agent, or Firm* — Schwabe, Williamson & Wyatt, P.C.

(57) ABSTRACT

Embodiments disclosed herein include an electronics package and methods of forming such electronics packages. In an embodiment, the electronics package comprises a plurality of build-up layers. In an embodiment, the build-up layers comprise conductive traces and vias. In an embodiment, the electronics package further comprises a capacitor embedded in the plurality of build-up layers. In an embodiment, the capacitor comprises: a first electrode, a high-k dielectric layer over portions of the first electrode, and a second electrode over portions of the high-k dielectric layer.

24 Claims, 26 Drawing Sheets

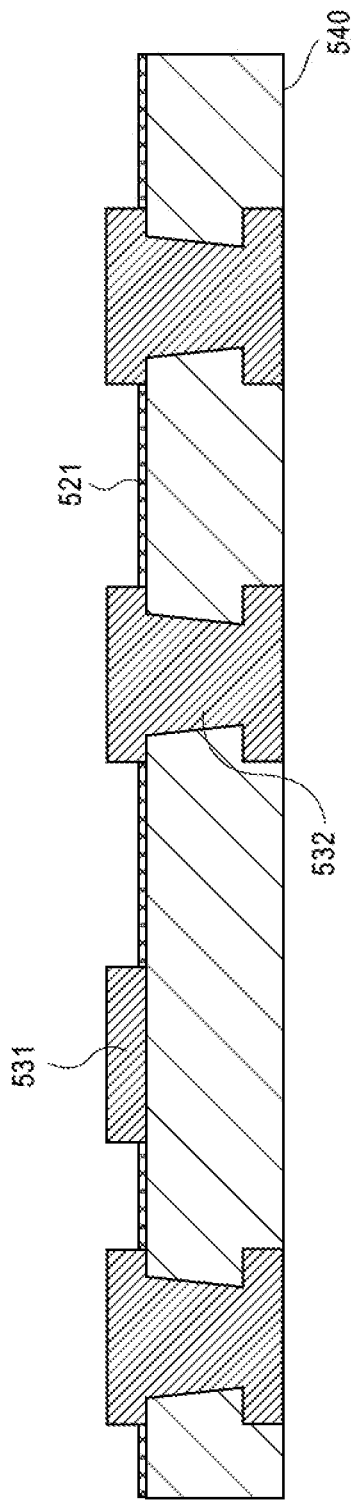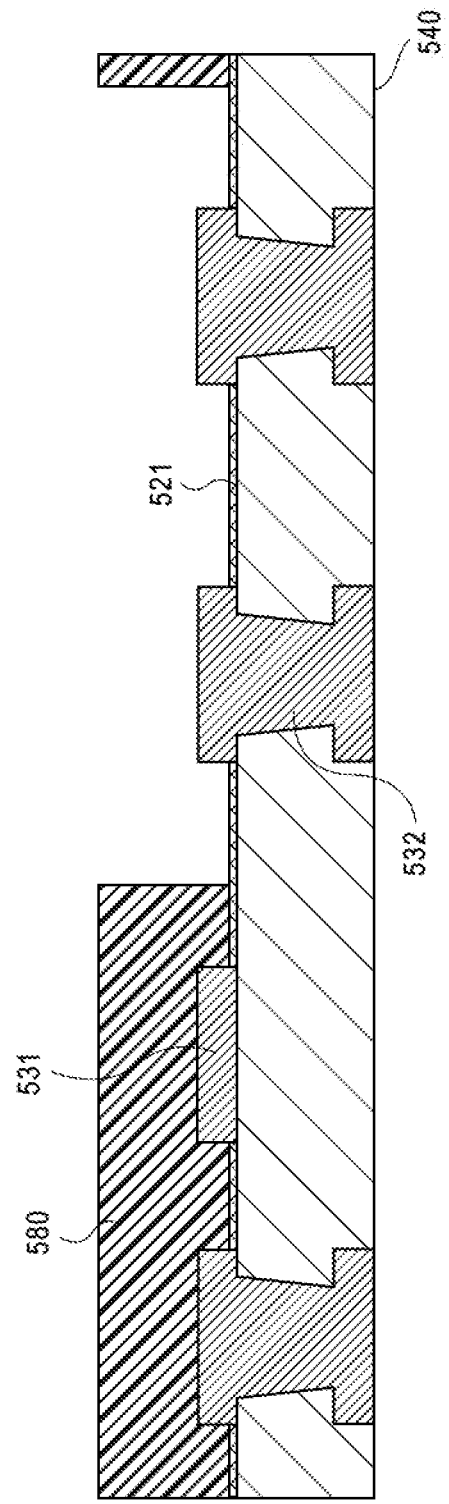

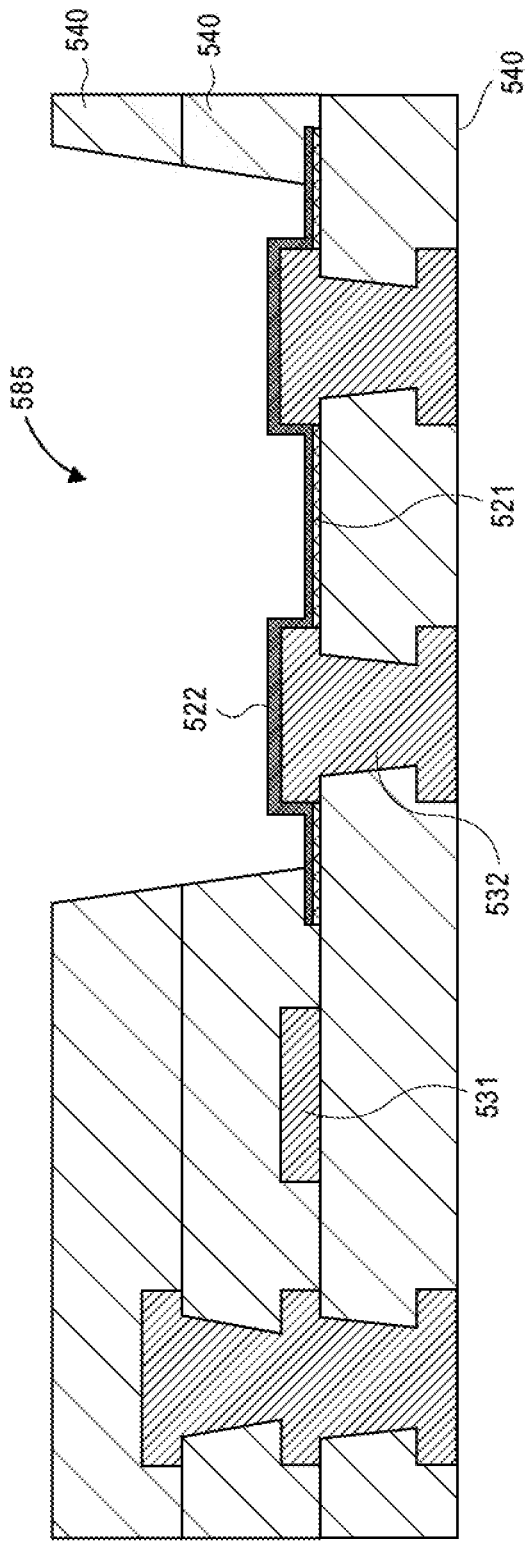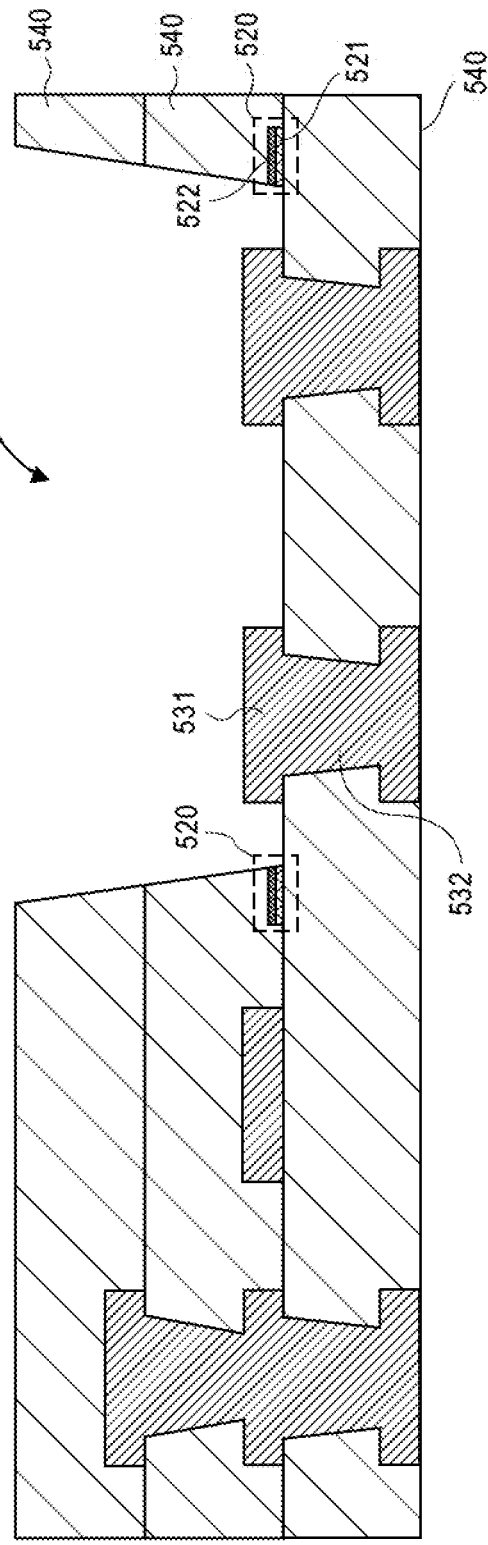

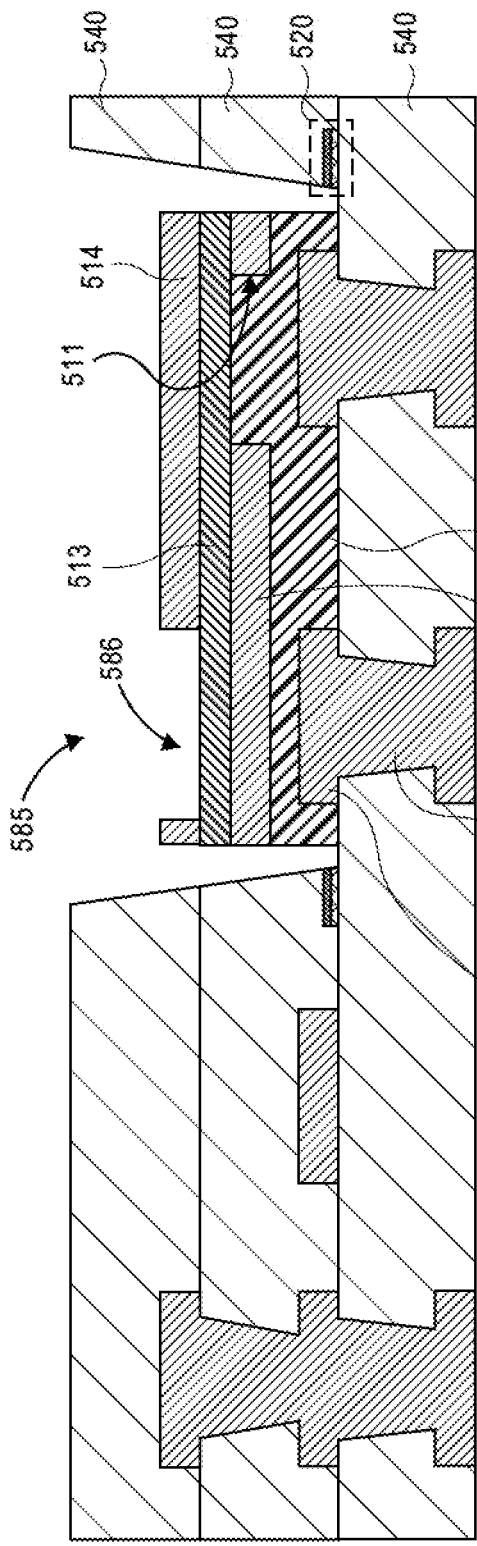
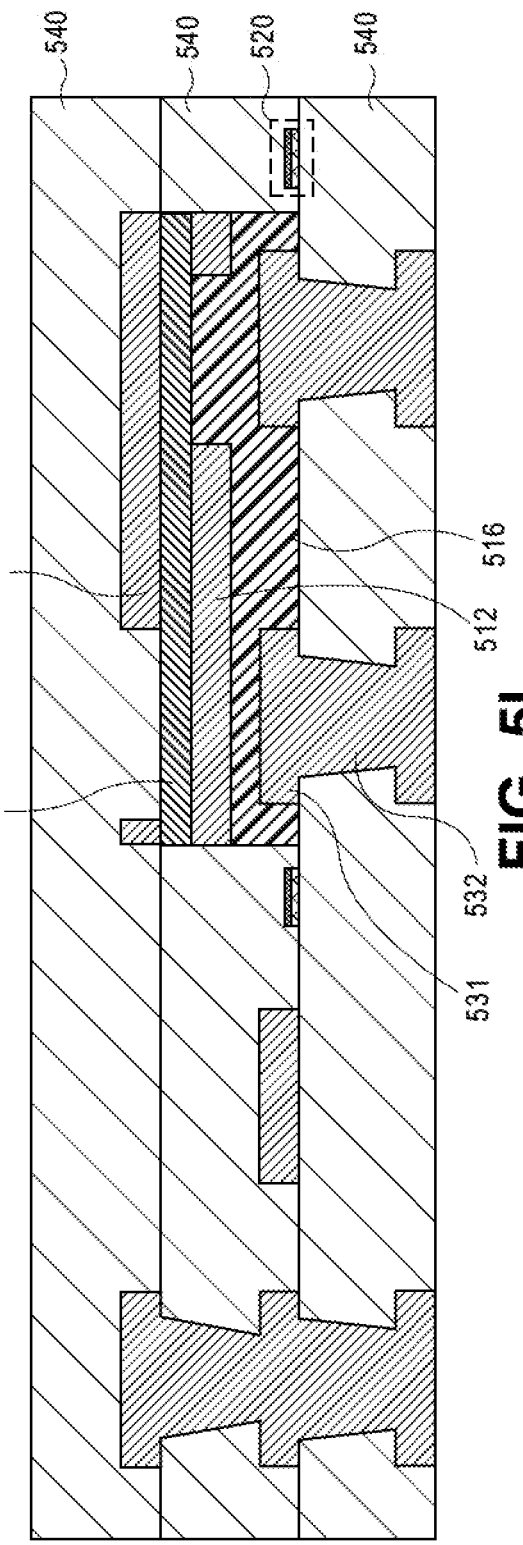
FIG. 5H
FIG. 5I

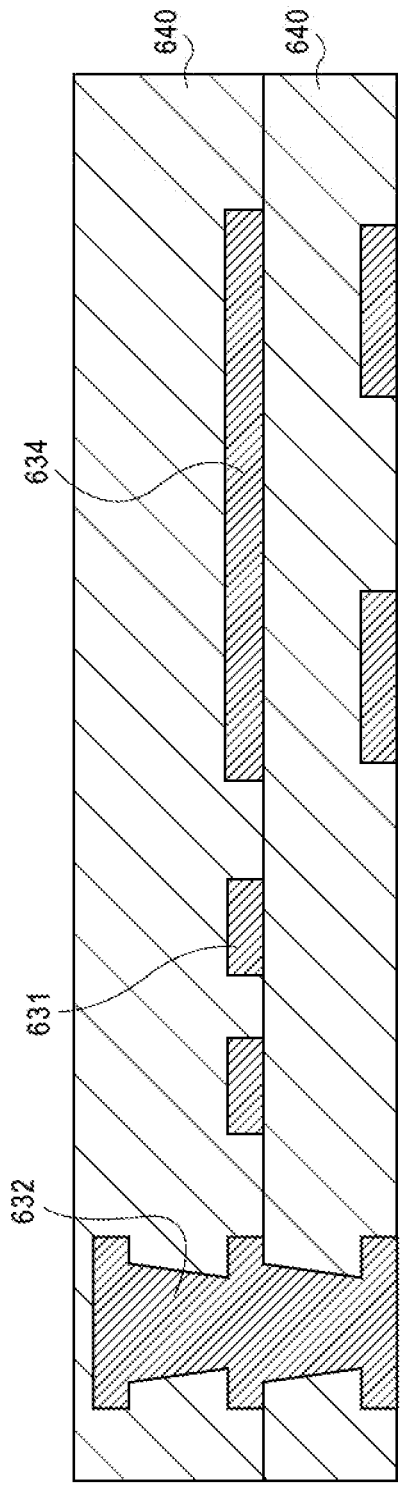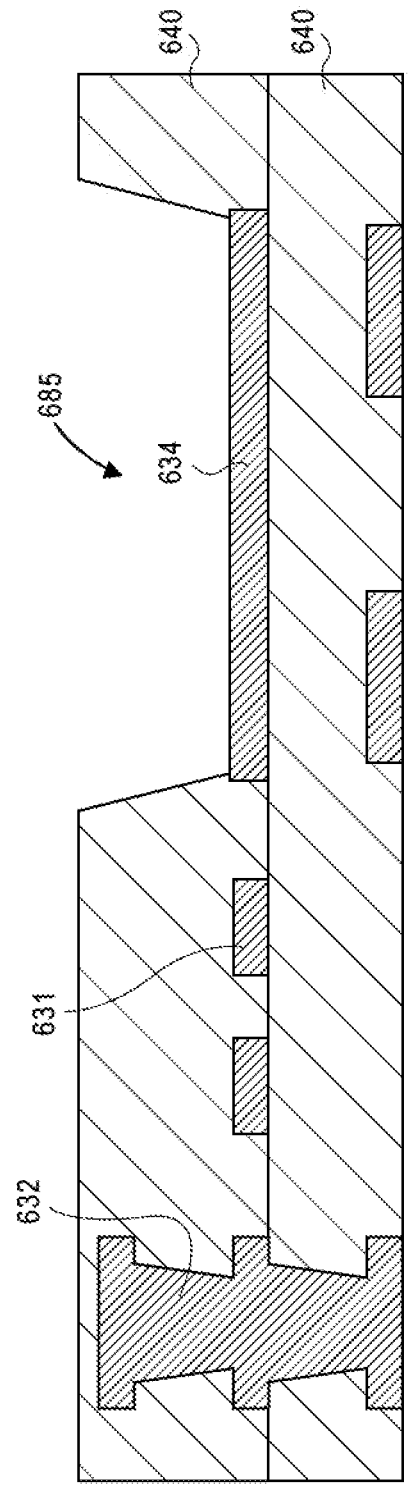
FIG. 6A
FIG. 6B

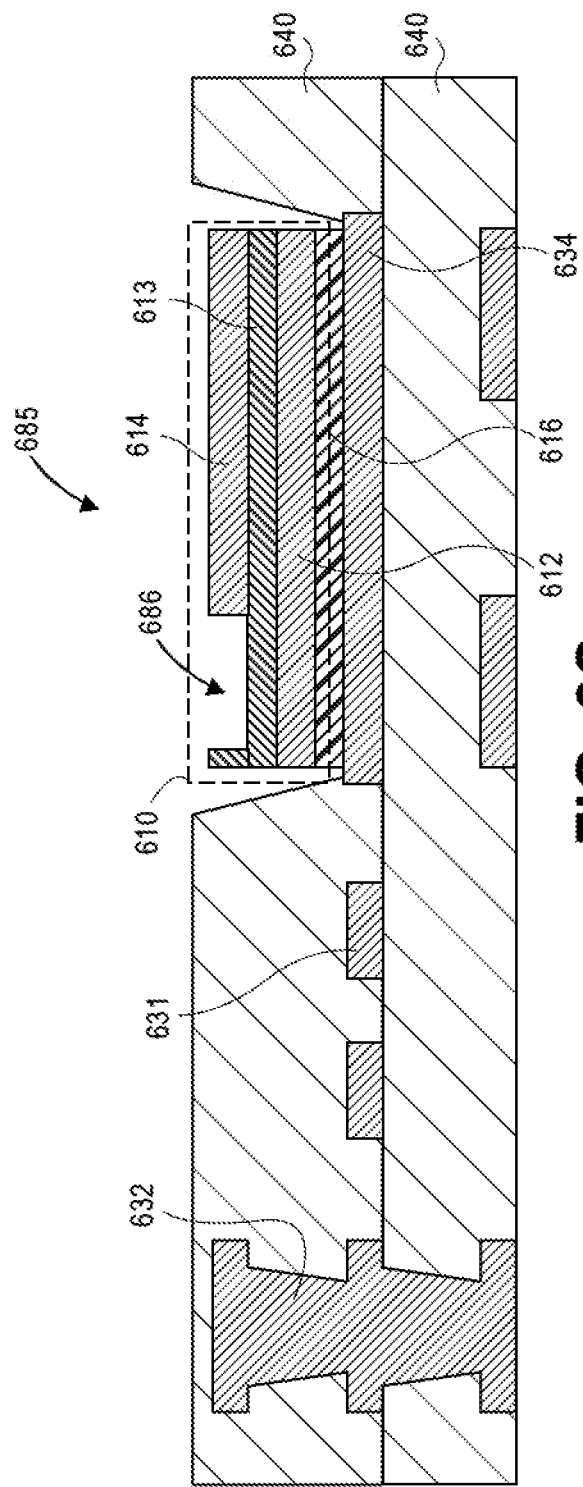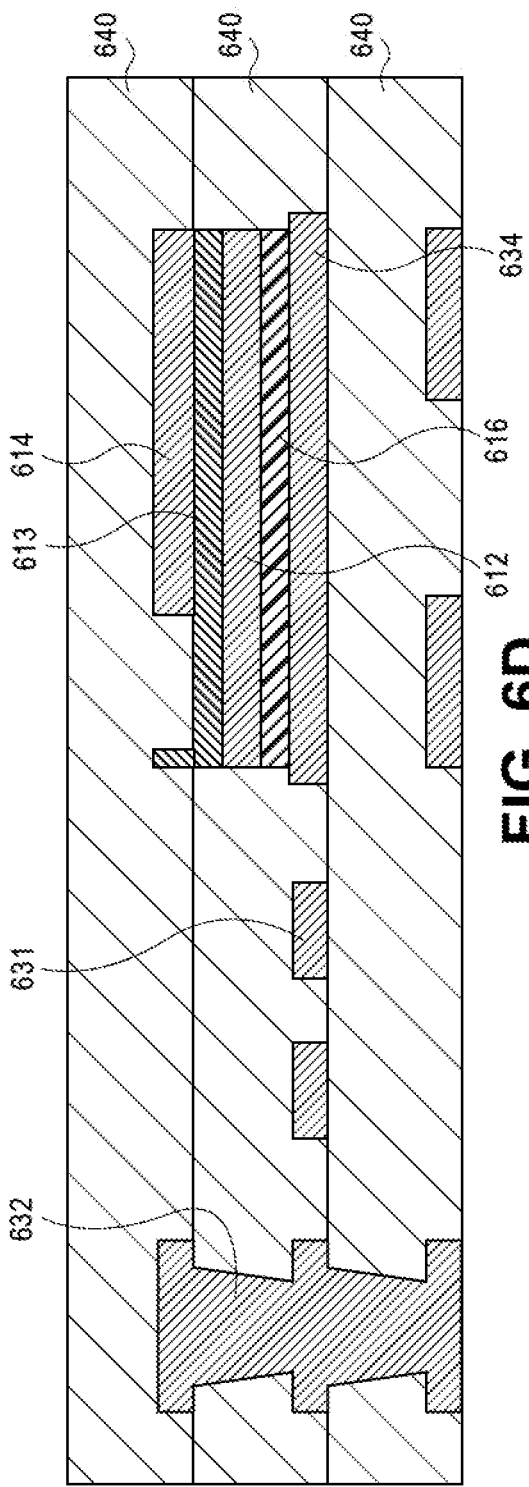

METHODS TO INCORPORATE THIN FILM CAPACITOR SHEETS (TFC-S) IN THE BUILD-UP FILMS

TECHNICAL FIELD

Embodiments of the present disclosure relate to electronics packaging, and more particularly, to thin film capacitors that are fabricated with thin film capacitor sheets (TFC-S). In an embodiment, the TFC-S is incorporated into the build-up films

BACKGROUND

First droop and power delivery (PD) noise are roadblocks as processors continue to pull more power. First droop is caused by the active circuitry inside the die beginning to pull power. Current solutions for improving first droop involve adding capacitance to the circuits that provide power to the die. Adding capacitors that are proximate to the die (i.e., to the origin of the droop) is preferable. Adding capacitance proximate to the die also decreases any inductive components of the impedance that are usually present due to the routing that connects the capacitance to the die. To efficiently improve first droop by increasing the PD capacitance, the capacitors need to be placed as close to the die as possible or even within the die itself.

Currently, metal insulator metal (MIM) capacitors are integrated into the back end of the die to improve first droop. However, adding additional MIM capacitors in the back end is not without issue. As power continues to scale, the use of additional MIM capacitors in the back end of the die is not a practical option.

Additional first droop solutions may include the use of land-side capacitors (LSCs). LSCs are surface mounted discrete components with high inductance contacts. Furthermore, the electrical path from the LSCs to the die is relatively long. This adds parasitic inductance, and the benefits of the LSCs are significantly reduced. Due to the location of the LSCs, the LSCs also interfere with the package/board interface.

A third option for improving first droop is by using ultra-high-k materials such as PZT and $BaTiO_3$. However, ultra-high-k materials require high-temperature anneals (e.g., 500° C. or greater) to form the proper crystal structures that provide the high-k characteristic of such materials. Reaching such high temperatures to allow for proper crystallization is not possible with organic build-up materials, and therefore, requires the use of laser annealing. The inclusion of laser annealing is disruptive to currently used high volume manufacturing processes, and is therefore not an ideal option.

BRIEF DESCRIPTION OF THE DRAWINGS

FIG. 5A is a cross-sectional illustration of a build-up layer, in accordance with an embodiment.

FIG. 5B is a cross-sectional illustration of the build-up layer after a resist layer is formed and patterned, in accordance with an embodiment.

FIG. 5E is a cross-sectional illustration after a cavity is formed into the build-up layers over the laser stop layer, in accordance with an embodiment.

FIG. 5F is a cross-sectional illustration after portions of the laser stop layer are removed, in accordance with an embodiment.

FIG. 5H is a cross-sectional illustration after a first electrode of the TFC-S is patterned, in accordance with an embodiment.

FIG. 5I is a cross-sectional illustration after an additional build-up layer is formed to fill the cavity, in accordance with an embodiment.

FIG. 6A is a cross-sectional illustration of a build-up layer with a laser stop, in accordance with an embodiment.

FIG. 6B is a cross-sectional illustration after a cavity is formed into the build-up layer to expose the laser stop layer, in accordance with an embodiment.

FIG. 6C is a cross-sectional illustration after a TFC-S is disposed in the cavity, in accordance with an embodiment.

FIG. 6D is a cross-sectional illustration after a build-up layer is formed to fill the cavity, in accordance with an embodiment.

EMBODIMENTS OF THE PRESENT DISCLOSURE

Described in embodiments herein are electronics packages with thin film capacitor sheets (TFC-S) and methods of forming packages with such TFC-S embedded in the electronics package. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order not to obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

As noted above, the existing solutions to minimizing first droop each have significant drawbacks. Accordingly, embodiments described herein include capacitors formed with thin film capacitor sheets (TFC-S) that are embedded within the build-up layers of the package substrate. Using a TFC-S is particularly beneficial because it enables the use of high-k dielectric materials that are otherwise not compatible with organic packaging process flows, as described above. A TFC-S allows for the high-k dielectric material to be formed on a layer (e.g., nickel) that is compatible with the high temperatures needed to deposit the high-k dielectric layer, and then be integrated into the package with compatible processes, such as pick-and-place operations or the like. The TFC-S may then be patterned using existing processes that are compatible with organic package substrate manufacturing.

In an embodiment, the capacitors may be formed in layers of the electronics package that are proximate to the die. In a particular embodiment, one or more capacitors may be formed in the die shadow (i.e., directly below the die). The proximity to the die provides maximum benefit in reducing first droop. However, it is to be appreciated that such capacitors formed with a TFC-S may be formed in any layer (or in a plurality of layers) in the package. Furthermore, it is to be appreciated that capacitors that are formed with a TFC-S may also be used for other applications beyond reducing first droop and power delivery applications.

Figure 1:
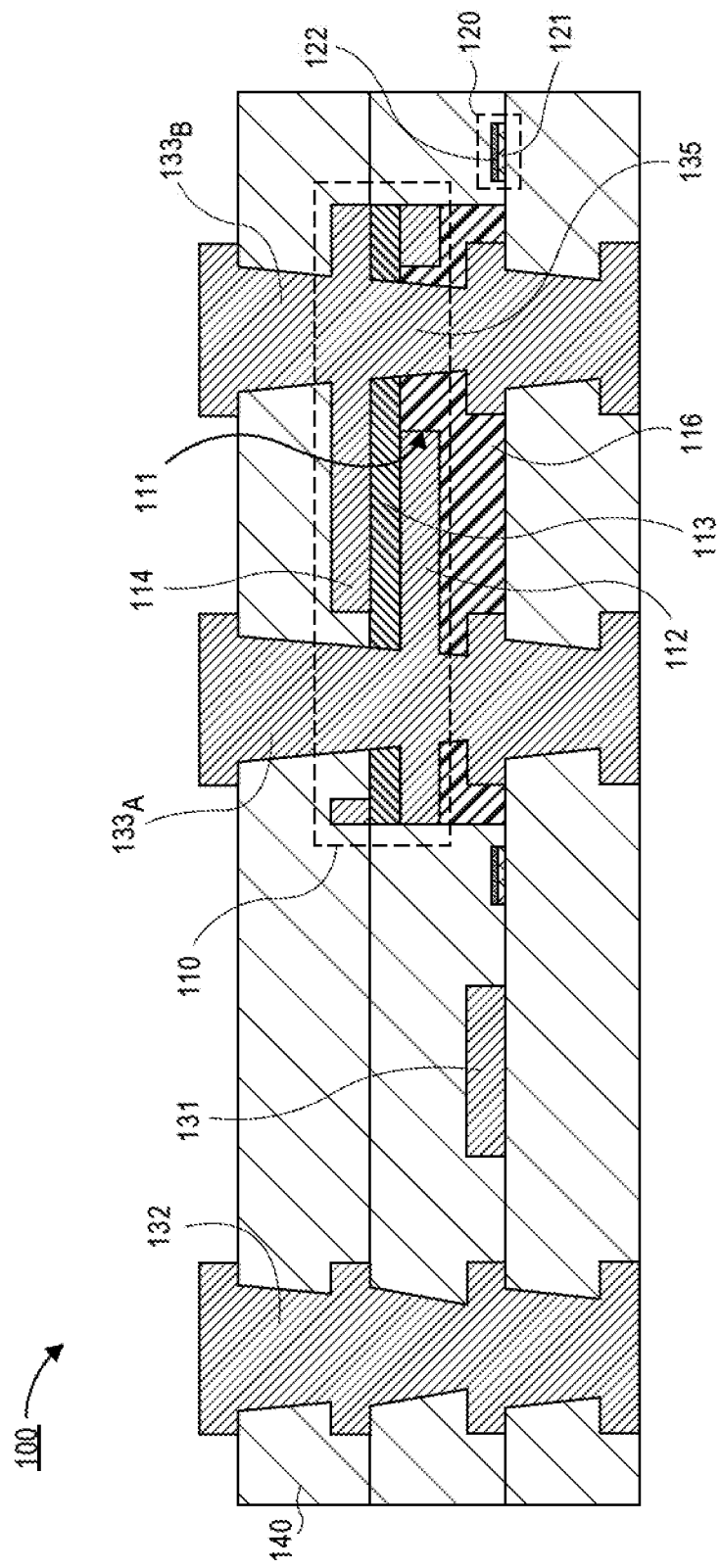
FIG. 1 is a cross-sectional illustration of an electronics package with a capacitor formed with a thin-film capacitor sheet (TFC-S), in accordance with an embodiment.

Referring now to FIG. 1, a cross-sectional illustration of an electronics package 100 is shown, in accordance with an embodiment. In an embodiment, the electronics package 100 may comprise a plurality of build-up layers 140. The build-up layers 140 may comprise dielectric layers and conductive features, such as conductive traces 131 and vias 132. The conductive traces 131 and vias 132 may be formed with processes known to those skilled in the art.

In an embodiment, the electronics package 100 may comprise a capacitor 110. In an embodiment, the capacitor 110 may be formed from a TFC-S that is disposed in a cavity formed in to the build-up layers, as will be described in greater detail below. In an embodiment, the TFC-S may comprise a plurality of layers for forming a capacitor 110. In an embodiment, the capacitor 110 may comprise a first electrode 112 and a second electrode 114. The first electrode 112 and the second electrode 114 may be separated by a high-k dielectric layer 113 formed between the first electrode 112 and the second electrode 114.

In an embodiment, the first electrode 112 and the second electrode 114 may be any suitable conductive materials. In a particular embodiment, the first electrode 112 may be a different material than the second electrode 114. For example, the first electrode 112 may be nickel and the second electrode 114 may be copper. However, embodiments are not limited to such configurations, and the first electrode 112 may be the same material as the second electrode 114 in some embodiments.

In an embodiment, the high-k dielectric layer 113 may be any suitable high-k dielectric layer. As used herein a "high-k" dielectric material refers to dielectric materials with a k-value that is greater than 50, greater than 80, or greater than 100. For example, the high-k dielectric layer may be PZT, BaTiO$_3$, BaHfO3, SrTiO3, or the like. Furthermore, while the high-k dielectric layer 113 is shown as a single material in the figures, it is to be appreciated that the high-k dielectric layer 113 may comprise a stack of a plurality of high-k dielectric materials. In yet another embodiment, the first and second electrodes 112, 114 may be separated from the high-k dielectric layer 113 by an intermediate conductive layer (not shown) that may be used to limit diffusion, or otherwise improve the functionality of the capacitor 110.

In an embodiment, the high-k dielectric layer 113 may have a thickness that is approximately 100 μm or less, 50 μm or less, 20 μm or less, or 1 μm or less. In some embodiments, the combined thickness of the first electrode 112, the high-k dielectric layer 113, and the second electrode 114 may be greater than a thickness of a single build-up layer. In such embodiments, the capacitor 110 may be embedded in a plurality of build-up layers by forming a cavity, as will be described in greater detail below. However, embodiments are not limited to such configurations, and when the thickness of the capacitor 110 is less than the thickness of a build-up layer, the cavity may be omitted.

In an embodiment, a first via 133$_A$ may provide an electrical connection to the first electrode 112. In an embodiment, the first via 133$_A$ may pass through an opening patterned into the second electrode 114. In an embodiment, the first via 133$_A$ may contact surfaces of the high-k dielectric layer 113. In an embodiment, a second via 133$_B$ may provide an electrical connection to the second electrode 114.

In an embodiment, the capacitor 110 may also comprise a backside film 116. In an embodiment the backside film 116 may be any suitable film for improving the adhesion between the capacitor 110 and the dielectric material of the build-up layer. In an embodiment, the backside film 116 may be formed over a surface of the first electrode 112. In some embodiments, the first electrode 112 may comprise one or more openings 111. In such embodiments, the openings 111 may be filled by the backside film 116. Accordingly, some embodiments may also comprise a backside film 116 that contacts portions of the high-k dielectric layer 113.

In an embodiment, the inclusion of openings 111 in the first electrode 112 allows for vertical connections to be made through the capacitor 110. For example, via 135 may be made through the opening 111 in the first electrode 112. As such, embodiments do not interrupt the routing scheme and do not necessitate that routing be made around the capacitor 110.

In an embodiment, laser stop traces 120 may be formed around a perimeter of the capacitor 110. In an embodiment, the laser stop traces 120 may be electrically isolated from other conductive components and/or features of the electronics package 100. The laser stop traces 120 are an artifact of the processing and may function as an indicator that methods described herein to form an electronics package 100 with a capacitor 110 were used, as will be described in greater detail below. In an embodiment, the laser stop traces 120 may comprise a laser stop layer 122 that is formed over a seed layer 121.

Figure 2:
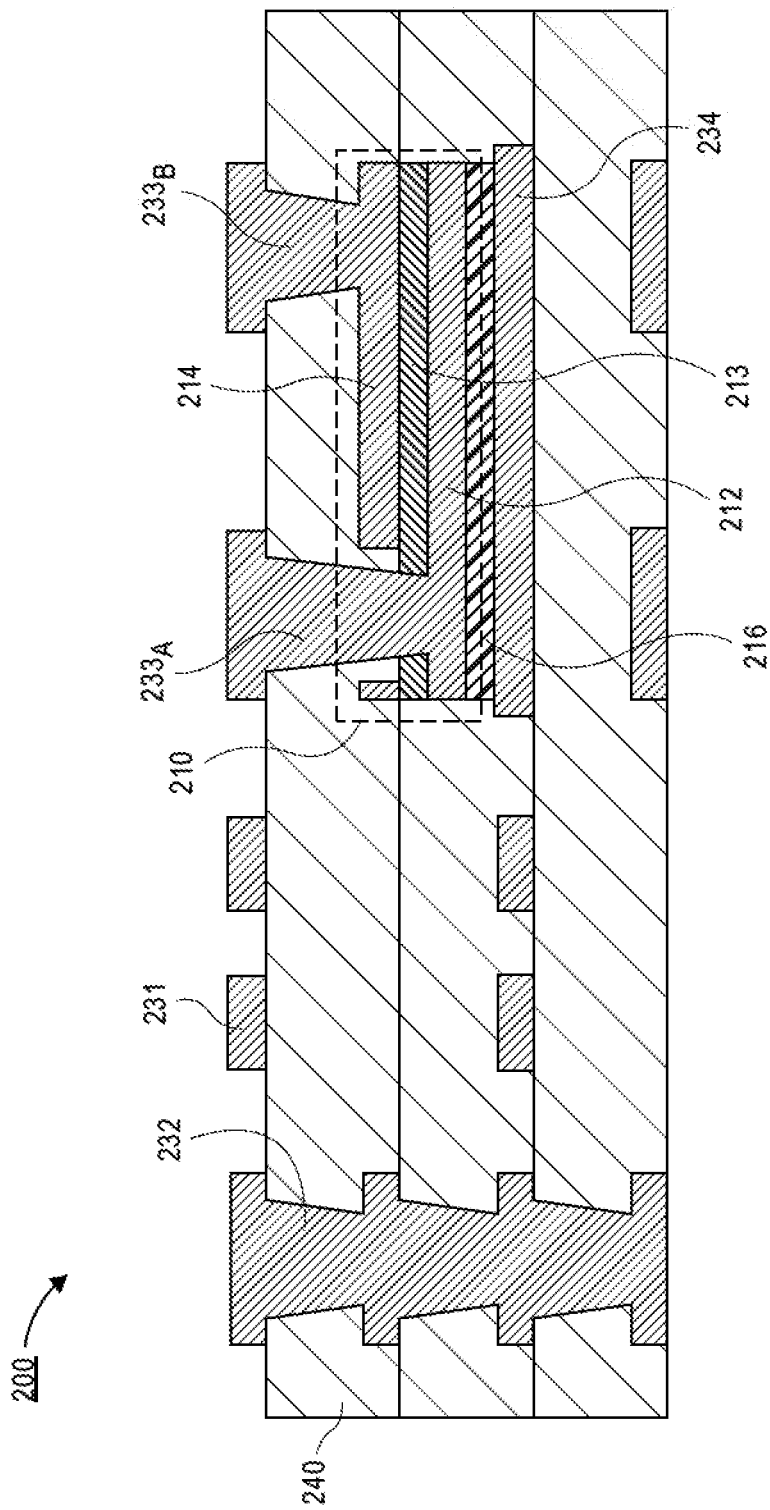
FIG. 2 is a cross-sectional illustration of an electronics package with a capacitor formed with a TFC-S with a laser stop layer below the capacitor, in accordance with an embodiment.

Referring now to FIG. 2, a cross-sectional illustration of an electronics package 200 is shown, in accordance with an additional embodiment. In an embodiment, the electronics package 200 may comprise a plurality of build-up layers 240. The build-up layers 240 may comprise conductive traces 231 and vias 232, as is known to those skilled in the art. In an embodiment, the electronics package 200 may comprise a capacitor 210. The capacitor 210 may be formed with a TFC-S. For example, the TFC-S may comprise a first electrode 212 and a second electrode 214. In an embodiment, a high-k dielectric layer 213 may be disposed between the first electrode 212 and the second electrode 214. The first electrode 212, the second electrode 214, and the high-k dielectric layer 213 may be formed of materials similar to those described above with respect to FIG. 1.

In an embodiment, the capacitor 210 may also comprise a backside film 216 formed in contact with the first electrode 212. In an embodiment, the backside film may improve the adhesion between the first electrode 212 and a laser stop layer 234. In an embodiment, the laser stop layer 234 may be a conductive material that is formed below the capacitor 210. The laser stop layer 234 may be electrically isolated from other conductive components and/or features in the electronics package 200. The laser stop layer 234 is an artifact of the processing and may function as an indicator that methods described herein to form an electronics package 200 with a capacitor 210 were used, as will be described in greater detail below.

In an embodiment, electrical connections to the first electrode 212 and the second electrode 214 may be formed from above by vias 233$_A$ and 233$_B$, respectively. In an embodiment the via 233$_A$ may pass through (but not contact) the second electrode 214 and pass through (and contact) the high-k dielectric layer 213. In an embodiment, the via 233$_B$ may pass through a build-up layer 240 to contact the second electrode 214.

Figure 3:
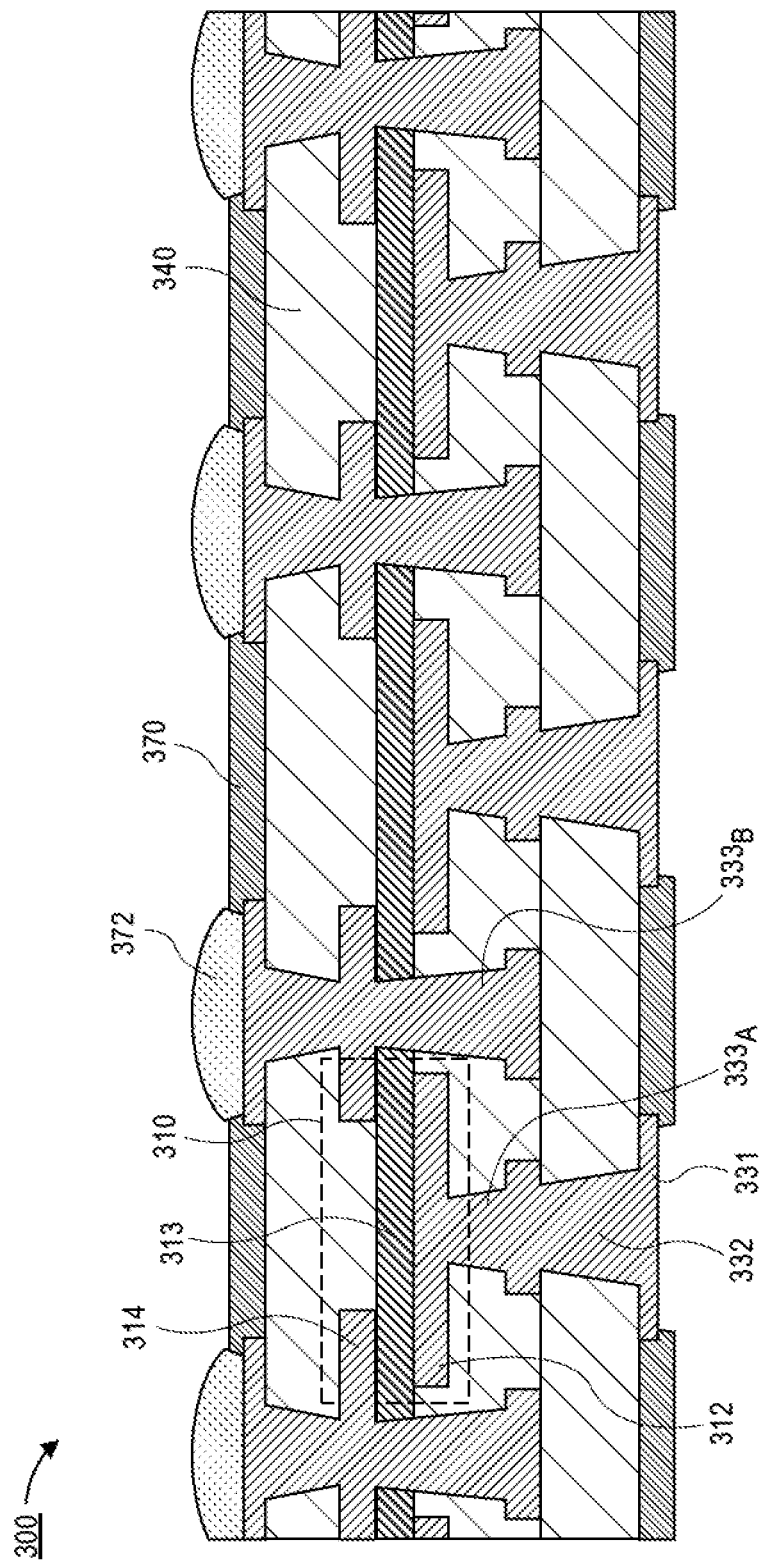
FIG. 3 is a cross-sectional illustration of a coreless electronics package with a capacitor formed with a TFC-S, in accordance with an embodiment.

Referring now to FIG. 3, a cross-sectional illustration of a coreless electronics package 300 is shown, in accordance with an embodiment. In an embodiment, the coreless electronics package 300 may comprise a plurality of build-up layers 340. In an embodiment, the build-up layers 340 may comprise a plurality of traces/pads 331 and vias 332, as is known to those skilled in the art. In an embodiment, the coreless electronics package 300 may comprise a capacitor 310. In an embodiment, the capacitor 310 may be comprised of a TFC-S. For example, the capacitor 310 may comprise a first electrode 312 and a second electrode 314. In an embodiment, the second electrode 314 is separated from the first electrode 312 by a high-k dielectric layer 313. In an embodiment, the first electrode 312, the second electrode 314, and the high-k dielectric layer 313 may be formed of materials similar to those described above with respect to FIG. 1. In an embodiment, vias 333$_A$ and 333$_B$ may provide electrical connections to the first electrode 312 and the second electrode 314, respectively.

In an embodiment, a plurality of capacitors 310 may be formed from a single TFC-S. For example, a plurality of first electrodes 312 and a plurality of second electrodes 314 may be patterned into a single TFC-S, as shown in FIG. 3. However, it is to be appreciated that the plurality of capacitors 310 may also be configured in parallel and function as single large area capacitor.

In an embodiment, the coreless electronics package 300 may comprise first level interconnects (FLIs) 372 over conductive pads 331. While not shown in FIG. 3, it is to be appreciated that second level interconnects (SLIs) may be formed on the surface of the coreless electronics package 300 opposite from the FLIs 372. In an embodiment, the FLIs 372 may be isolated by a solder resist 370, as is known in the art.

Figure 4:
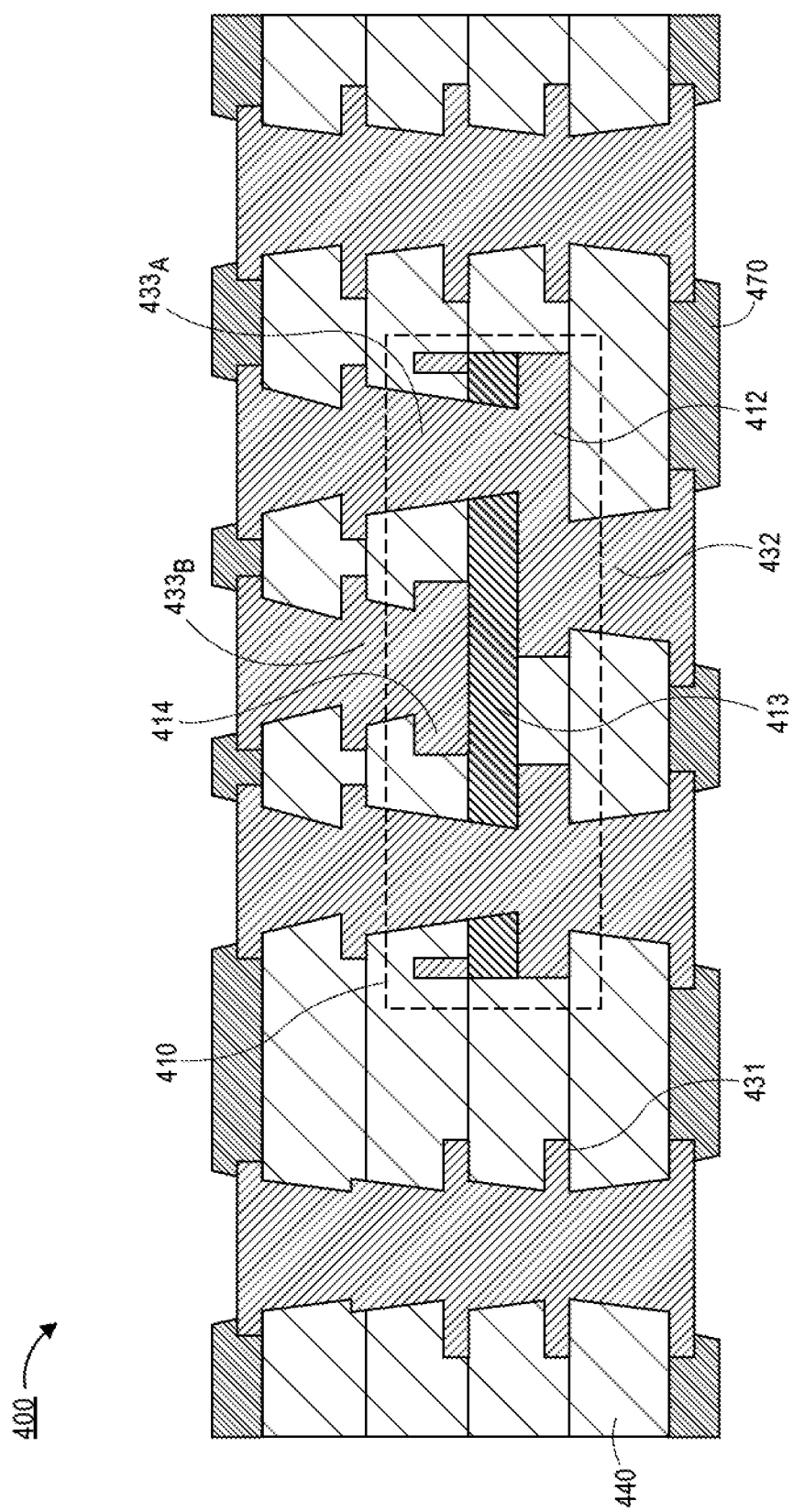
FIG. 4 is a cross-sectional illustration of a coreless electronics package with a capacitor formed with a TFC-S formed in a cavity in a build-up layer, in accordance with an embodiment.

Referring now to FIG. 4, a cross-sectional illustration of a coreless electronics package 400 is shown, in accordance with an embodiment. In an embodiment, the coreless electronics package 400 may comprise a capacitor 410 embedded within build-up layers 440. In an embodiment the coreless electronics package 400 may be substantially similar to the coreless electronics package 300 described with respect to FIG. 3, with the exception that the TFC-S is disposed in a cavity (not shown in FIG. 4) instead of being a continuous sheet.

In an embodiment, the capacitor 410 may comprise a first electrode 412 and a second electrode 414. In an embodiment, a high-k dielectric layer 413 may be formed between the first electrode 412 and the second electrode 414. In embodiment, the first electrode 412, the second electrode 414 and the high-k dielectric layer 413 may be formed of materials similar to those described above with respect to FIG. 1. In an embodiment, vias $433_A$ and $433_B$ may provide electrical connections to the first electrode 412 and the second electrode 414, respectively. In an embodiment the via $433_A$ may pass through (but not contact) the second electrode 314 and pass through (and contact) the high-k dielectric layer 413. In an embodiment, the via $433_B$ may pass through a build-up layer 440 to contact the second electrode 414. In an embodiment, the coreless electronics package 400 may also comprise a plurality of build-up layers 440 that comprise traces 431 and vias 432.

Referring now to FIGS. 5A-5K, a series of cross-sectional illustrations that depict a process for forming an electronics package similar to the electronics package 100 described above with respect to FIG. 1 is shown, in accordance with an embodiment.

Referring now to FIG. 5A, a cross-sectional illustration of a build-up layer 540 is shown, in accordance with an embodiment. In an embodiment, build-up layer 540 may be any layer of an electronics package. For example, the build-up layer 540 may be a first build-up layer formed over a package core (not shown). Additional embodiments include any number of underlying build-up layers (not shown) below the illustrated build-up layer 540. In an embodiment, the build-up layer 540 may comprise a plurality of vias 532 and traces 531, as is known in the art. In an embodiment, a seed layer 521 used to form the traces 531 may remain over surfaces of the build-up layer 540.

Referring now to FIG. 5B, a cross-sectional illustration after a resist layer 580 is disposed over the build-up layer 540 and patterned is shown, in accordance with an embodiment. In an embodiment, the resist layer 580 may be any suitable resist layer. For example, the resist layer 580 may be a dry film resist (DFR) or the like. In an embodiment, the patterned opening through the resist layer 580 exposes one or more conductive traces 531 and portions of the seed layer 521. The opening through the resist layer 580 may be positioned in a location where a capacitor is desired.

Figure 5C:
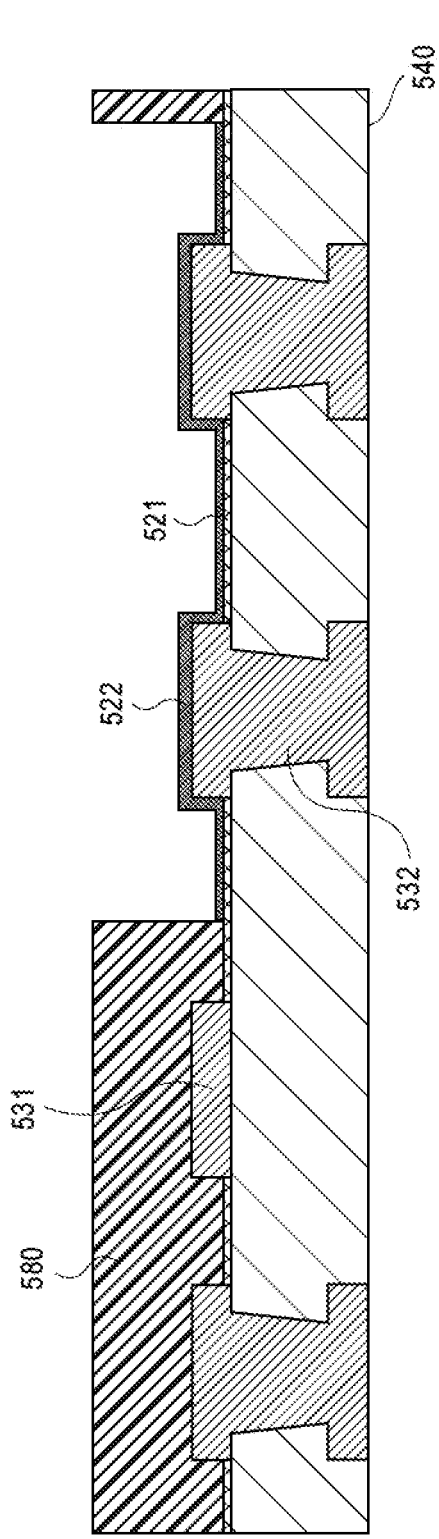
FIG. 5C is a cross-sectional illustration of after a laser stop layer is disposed in the resist opening, in accordance with an embodiment.

Referring now to FIG. 5C, a cross-sectional illustration after a laser stop layer 522 is formed over the seed layer 521 is shown, in accordance with an embodiment. In an embodiment, the laser stop layer 522 may be a material that is etch selective to the underlying seed layer 521. For example, the laser stop layer 522 may be nickel or the like. In an embodiment, the laser stop 522 may be approximately 10 μm thick or less.

Figure 5D:
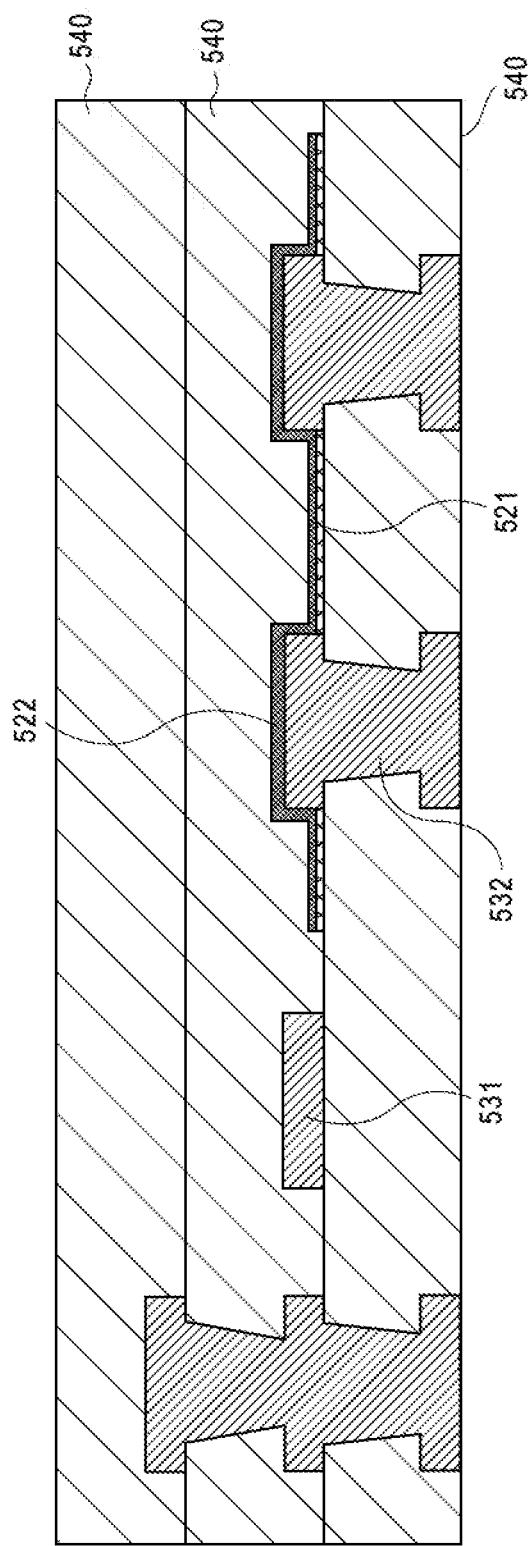
FIG. 5D is a cross-sectional illustration after additional build-up layers are disposed over the first build-up layer, in accordance with an embodiment.

Referring now to FIG. 5D, a cross-sectional illustration after additional build-up layers 540 are disposed over the first build-up layer is shown, in accordance with an embodiment. In an embodiment, the resist layer 580 may be stripped and the exposed portions of the seed layer 521 may be etched away with a flash etching process. In an embodiment, subsequent build-up layers 540 may be formed with processes known in the art, such as lamination processes. In an embodiment, the subsequent build-up layers 540 may comprise conductive traces 531 and vias 532 formed with known processes, such as semi-additive processing (SAP) or the like. In the illustrated embodiment, two build-up layers 540 are formed over the laser stop layer 522. However, it is to be appreciated that any number of build-up layers may be disposed over the laser stop layer 522, depending on the thickness of the TFC-S used to form the capacitor.

Referring now to FIG. 5E, a cross-sectional illustration after a cavity 585 is formed into the build-up layers 540 is shown, in accordance with an embodiment. In an embodiment, the cavity 585 may be formed with a laser drilling process that ablates portions of the build-up layers 540 above the laser stop layer 522. In an embodiment, portions of the laser stop layer 522 may remain unexposed.

Referring now to FIG. 5F, a cross-sectional illustration after the exposed portions of the laser stop layer 522 and the underlying seed layer 521 are removed is shown, in accordance with an embodiment. In an embodiment, the laser stop layer 522 may be removed with an etching process, and the underlying seed layer 521 may also be removed with an etching process. As shown, portions of the laser stop layer 522 and the underlying seed layer 521 (referred to collectively as a laser stop trace 520) may remain in the final structure since they are protected from the etching processes by the build-up layer 540. Accordingly, a cross-sectional analysis of an electronics package that shows a seed layer trace 520 that is electrically isolated from conductive features in the electronics package surrounding a perimeter of the capacitor may provide evidence that methods in accordance with embodiments described herein were used to fabricate the electronics package.

Figure 5G:
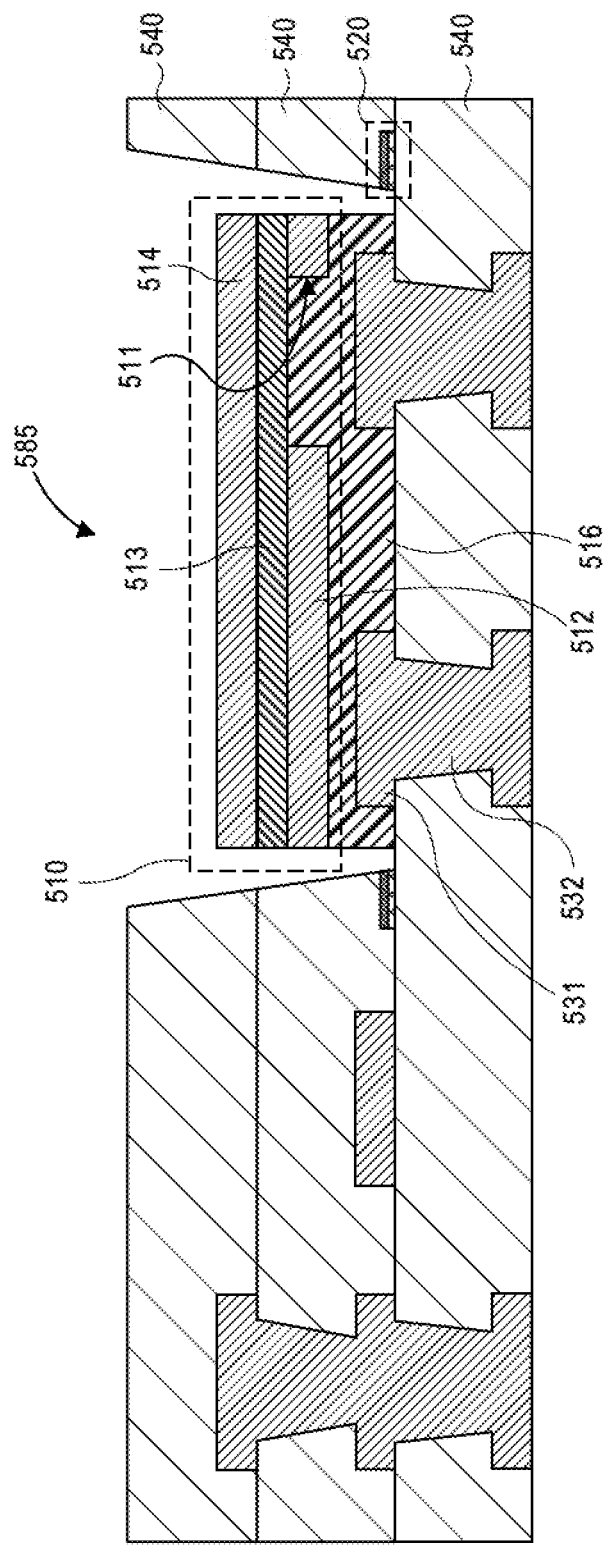
FIG. 5G is a cross-sectional illustration after the TFC-S is disposed in the cavity, in accordance with an embodiment.

Referring now to FIG. 5G, a cross-sectional illustration after a capacitor 510 is disposed in the cavity 585 is shown, in accordance with an embodiment. In an embodiment, the capacitor 510 may be disposed in the cavity 585 with any suitable process, such as a pick-and-place process, or the like. In an embodiment the capacitor 510 may comprise a TFC-S. For example, the capacitor 510 may comprise a first electrode 512, a second electrode 514, and a high-k dielectric film 513 between the first electrode 512 and the second electrode 514. In an embodiment, the capacitor 510 may further comprise a backside film 516 that is used to improve the adhesion between the capacitor 510 and the underlying buildup layer 540.

In an embodiment, the first electrode 512 may comprise one or more openings 511. In an embodiment, the openings 511 may allow for vertical connections to be made through the capacitor 510. In such embodiments, the openings 511 may be filled with the backside film 516. For example, the backside film 516 may fill the opening 511 and contact a portion of the high-k dielectric film 513. However, it is to be appreciated that embodiments are not limited to capacitors 510 with an opening 511 through the first electrode 512, and embodiments may also include a first electrode 512 without an opening 511.

Referring now to FIG. 5H, a cross-sectional illustration after the second electrode 514 is patterned is shown, in accordance with an embodiment. In an embodiment, the second electrode 514 may be patterned with a lithography process. In an embodiment, the second electrode 514 may be patterned to form an opening 586 that exposes a portion of the high-k dielectric layer 586.

Referring now to FIG. 5I, a cross-sectional illustration after the cavity 585 is filled with a build-up layer 540 is shown, in accordance with an embodiment. In an embodiment, the build-up layer 540 may be disposed with a lamination process, as is known in the art.

Figure 5J:
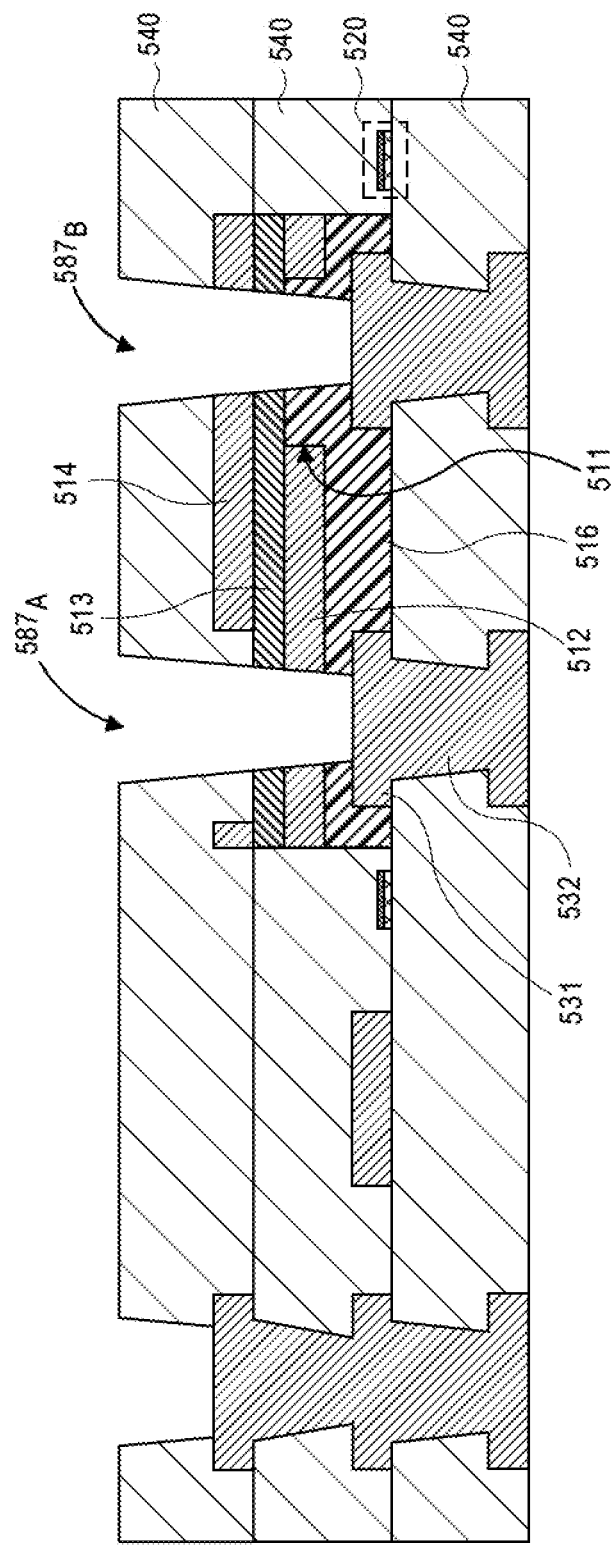
FIG. 5J is a cross-sectional illustration after via openings are formed through the TFC-S, in accordance with an embodiment.

Referring now to FIG. 5J, a cross-sectional illustration after via openings 587 are formed is shown, in accordance with an embodiment. In an embodiment, a first via opening 587$_A$ may provide an opening to the first electrode 512, and a second via opening 587$_B$ may provide an opening to the second electrode 514. In an embodiment, the via openings 587 may be formed with a laser drilling process. In an embodiment, the via openings 587 may pass through the capacitor 510 to expose traces (or pads) 531 below the capacitor 510. As such, vertical connections through the capacitor 510 are possible.

Figure 5K:
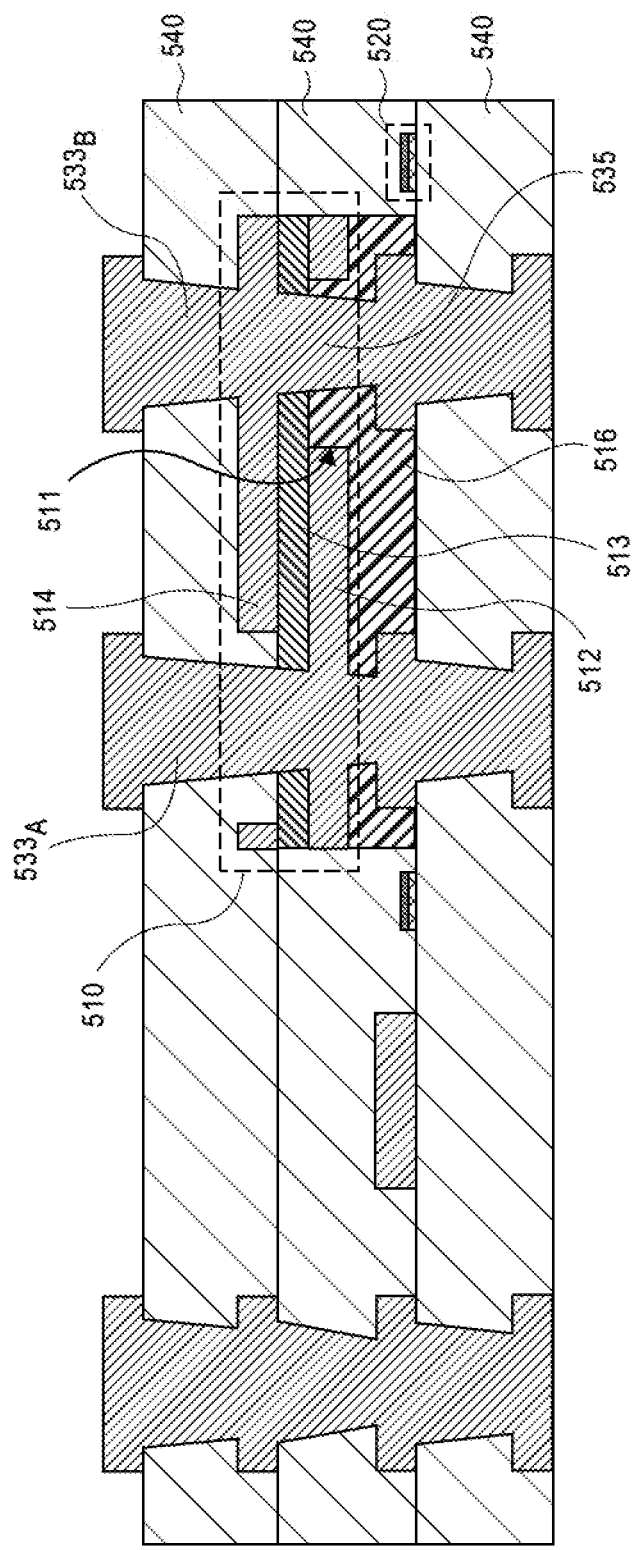
FIG. 5K is a cross-sectional illustration after vias are formed in the via openings, in accordance with an embodiment.

Referring now to FIG. 5K, a cross-sectional illustration after the vias are formed is shown, in accordance with an embodiment. In an embodiment, the first via 533$_A$ may provide an electrical connection to the first electrode 512, and the second via 533$_B$ may provide an electrical connection to the second electrode 514. In an embodiment, vias 535 may also be formed below the capacitor 510 in order to provide vertical connections through the capacitor 510. In an embodiment, one of the vias 535 may pass through the first electrode 512 (but not contact the first electrode 512). For example, the backside film 516 may separate the via 535 from the first electrode 512.

Referring not to FIGS. 6A-6F, a series of cross-sectional illustrations that illustrate a process for forming an electronics package similar to the electronics package described above with respect to FIG. 2 is shown, in accordance with an embodiment.

Referring now to FIG. 6A, a cross-sectional illustration of build-up layers 640 is shown, in accordance with an embodiment. In an embodiment, the build-up layers 640 may comprise traces 631 and vias 632 as is known in the art. In a particular embodiment, a laser stop layer 634 may be formed in the build-up layers 640. The laser stop layer 634 may be a conductive material that is electrically isolated from conductive features of the electronics package. The laser stop layer 634 may be copper or the like. In an embodiment, the laser stop layer 634 is positioned where a capacitor is desired.

Referring now to FIG. 6B, a cross-sectional illustration after a cavity 685 is formed into the build-up layers is shown, in accordance with an embodiment. In an embodiment, the cavity 685 may be formed with a laser drilling process. The laser drilling process exposes the laser stop layer 634 at the bottom of the cavity 685.

Referring now to FIG. 6C, a cross-sectional illustration after the capacitor 610 is disposed in the cavity is shown, in accordance with an embodiment. In an embodiment, the capacitor 610 may be a TFC-S that is disposed in the cavity 685 with a pick-and-place process. In an embodiment, the capacitor 610 may comprise a first electrode 612, a second electrode 614, and a high-k dielectric layer 613 between the first electrode 612 and the second electrode 614. In an embodiment, the second electrode 614 may be patterned to form an opening 686. In some embodiments, the opening 686 is patterned with a lithographic process after the capacitor 610 is placed into the cavity 685. In an embodiment, the capacitor 610 may also comprise a backside film 616. The backside film 616 may provide improved adhesion between the capacitor 610 and the laser stop layer 634.

Referring now to FIG. 6D, a cross-sectional illustration after a build-up layer 640 is formed into the cavity 685 is shown, in accordance with an embodiment. In an embodiment, the build-up layer may be formed over the cavity with a lamination process, as is known in the art.

Figure 6E:
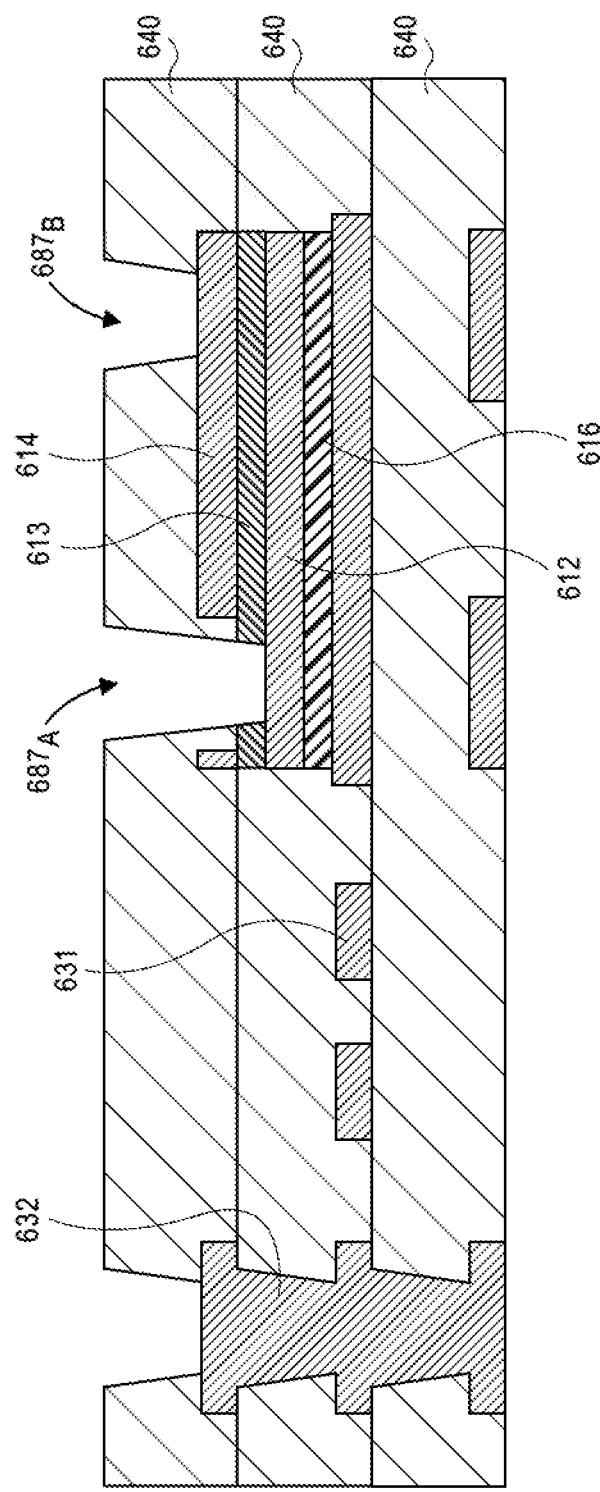
FIG. 6E is a cross-sectional illustration after via openings are formed into the build-up layer, in accordance with an embodiment.

Referring now to FIG. 6E, a cross-sectional illustration after via openings 687 are formed is shown, in accordance with an embodiment. In an embodiment, a first via opening 687$_A$ may be formed to expose a portion of the first electrode 612, a second via opening 687$_B$ may be formed to expose a portion of the second electrode 614. In an embodiment, the first via opening 687$_A$ may pass through the second electrode 614 (without contacting the first electrode 614) and pass through the high-k dielectric layer 613. In an embodiment, the via openings 687 may be formed with a laser drilling process.

Figure 6F:
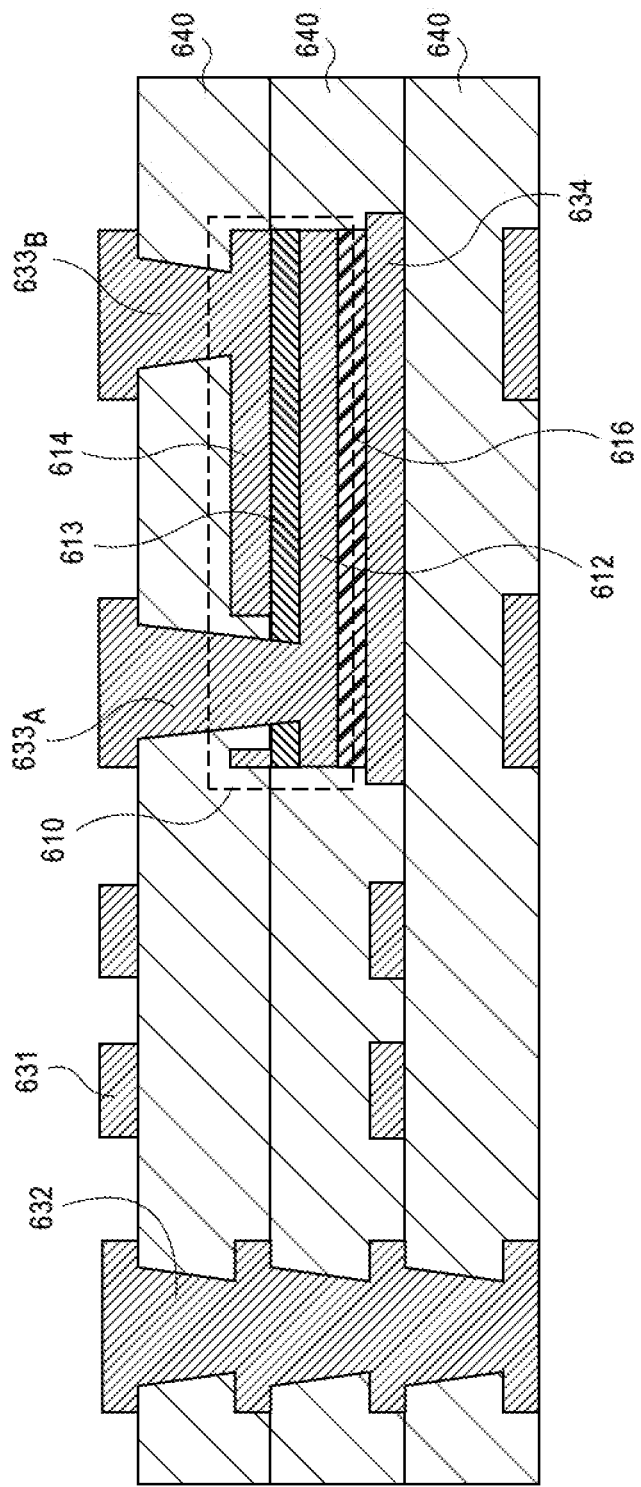
FIG. 6F is a cross-sectional illustration after vias are formed in the via openings, in accordance with an embodiment.

Referring now to FIG. 6F, a cross-sectional illustration after the vias are formed is shown, in accordance with an embodiment. In an embodiment, a first via 633$_A$ may be formed in the first via opening 687$_A$ and contact the first electrode 612. In an embodiment, a second via 633$_B$ may be formed in the second via opening 687$_B$ and contact the second electrode 614.

Referring now to FIGS. 7A-7J, a series of cross-sectional illustrations that illustrate a process for forming a coreless electronics package similar to coreless electronics package 300 described above with respect to FIG. 3 is shown, in accordance with an embodiment.

Figure 7A:
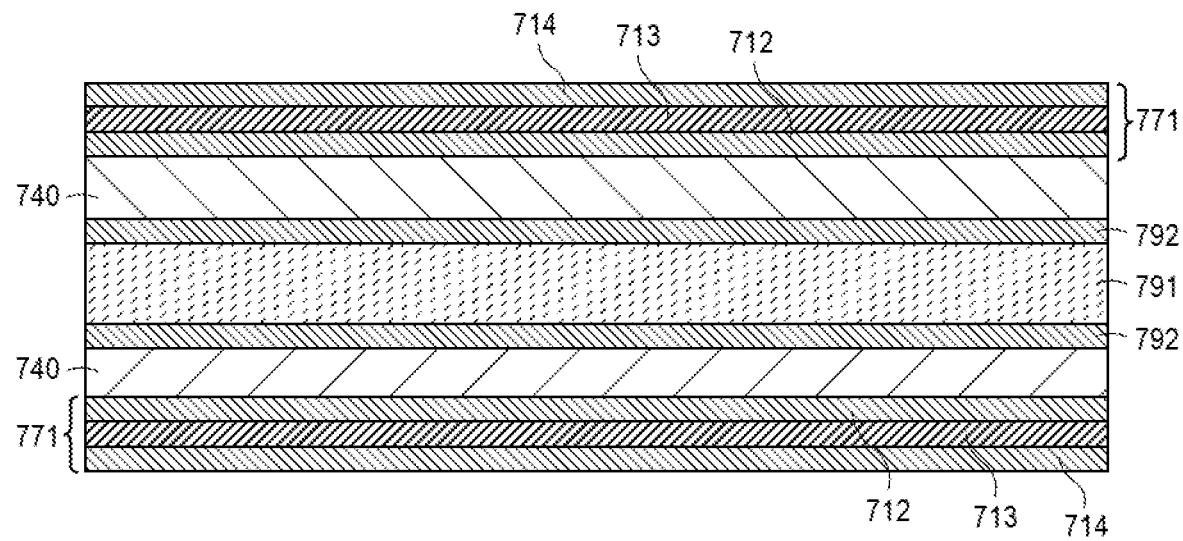
FIG. 7A is a cross-sectional illustration of a core with a TFC-S formed over the surfaces of build-up layers, in accordance with an embodiment.

Referring now to FIG. 7A, a cross-sectional illustration of a dummy core 791 with a TFC-S 771 formed on opposing surfaces is shown, in accordance with an embodiment. In an embodiment, a copper layer 792 and a build-up layer 740 may be positioned between each TFC-S 771 and the dummy core 791. In an embodiment, the TFC-S 771 may comprise a first electrode 712, a second electrode 714, and a high-k dielectric layer 713 between the first electrode 712 and the second electrode 714. In accordance with embodiments described herein, the processing operations may be implemented on both the top TFC-S 771 and the bottom TFC-S 771. For simplicity, only operations over one surface of the dummy core 791 will be described.

Figure 7B:
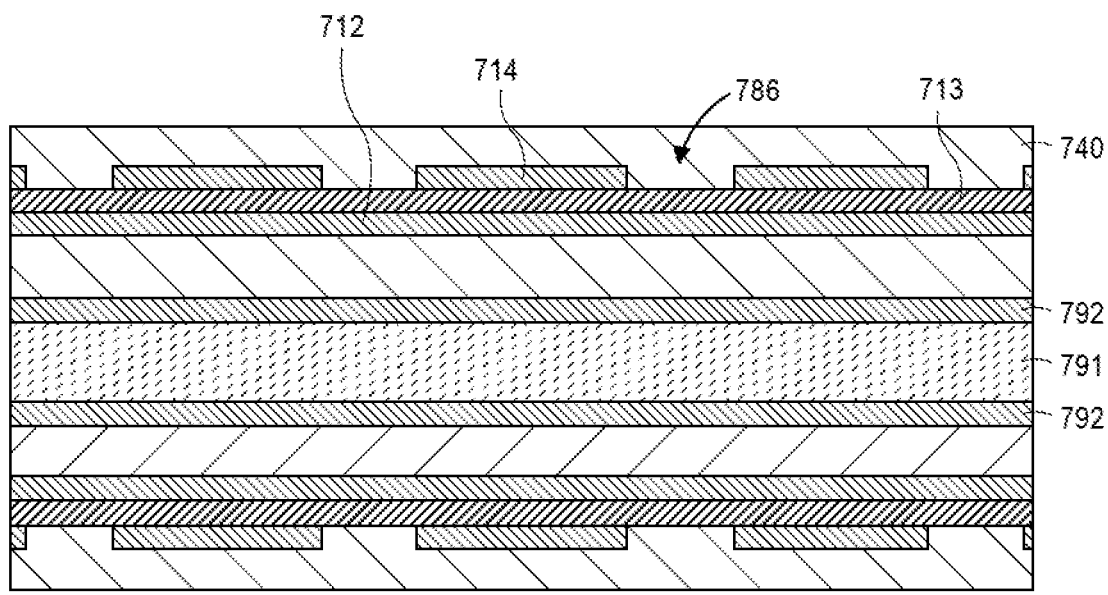
FIG. 7B is a cross-sectional illustration after the first electrode of the TFC-S is patterned, in accordance with an embodiment.

Referring now to FIG. 7B, a cross-sectional illustration after the second electrode 714 is patterned and a build-up layer 740 is laminated of the second electrode 714 is shown, in accordance with an embodiment. In an embodiment, opening 786 may be patterned into the second electrode 714 with a lithography process or the like.

Figure 7C:
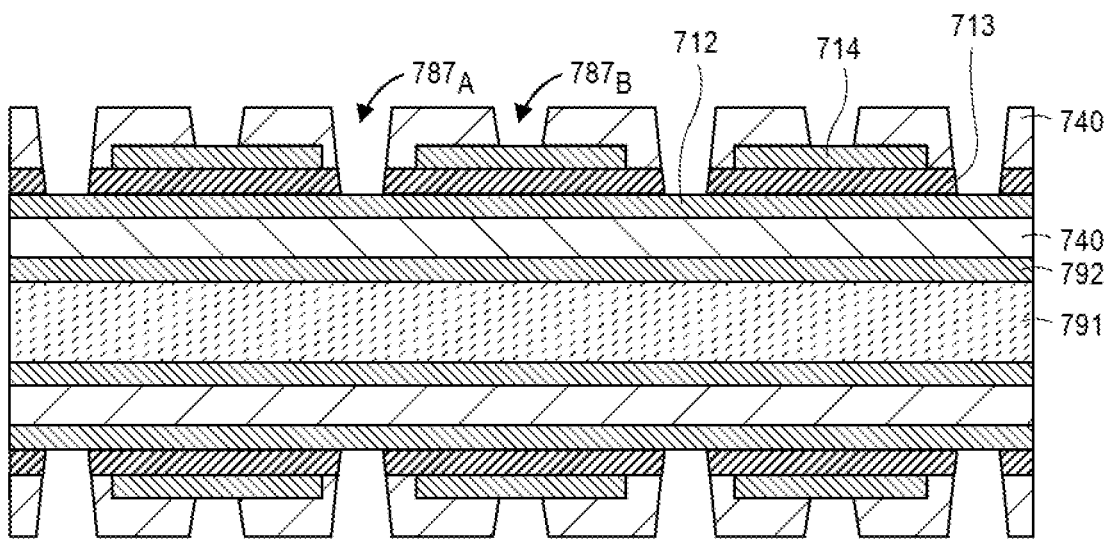
FIG. 7C is a cross-sectional illustration after via openings are formed to the first electrode and the second electrode of the TFC-S, in accordance with an embodiment.

Referring now to FIG. 7C, a cross-sectional illustration after via openings 787 are formed is shown, in accordance with an embodiment. In an embodiment, first via openings 787$_A$ are formed to expose portions of the first electrode 712, and second via openings 787$_B$ are formed to expose portions of the second electrode 714. In an embodiment, the first via openings 787$_A$ pass through the build-up layer 740, the openings 786 formed into the second electrode 714, and the high-k dielectric layer 713. In an embodiment, the second via openings 787$_B$ pass through the build-up layer 740. In an embodiment, the via openings 787 may be formed with a laser drilling process, or the like.

Figure 7D:
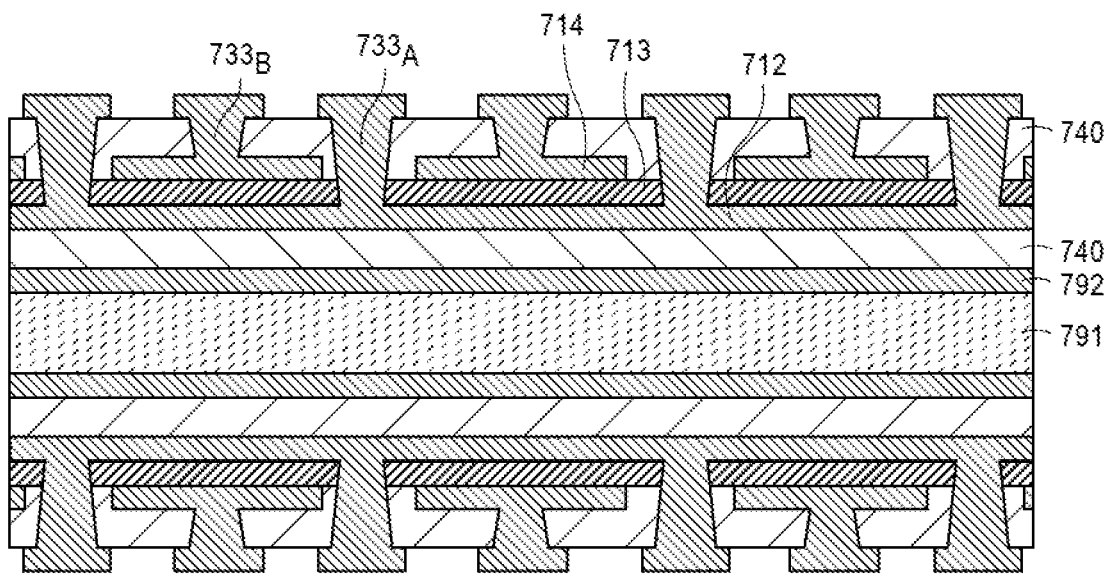
FIG. 7D is a cross-sectional illustration after vias are formed in the via openings, in accordance with an embodiment.

Referring now to FIG. 7D, a cross-sectional illustration after the vias 733 are formed is shown, in accordance with an embodiment. In an embodiment, the vias 733 may be formed with an electroplating process, or the like. For example, the vias 733 may be formed with a typical SAP process. In an embodiment, first vias 733$_A$ provide electrical connections to the first electrode 712, and second vias 733$_B$ provide electrical connections to the second electrode 714.

Figure 7E:
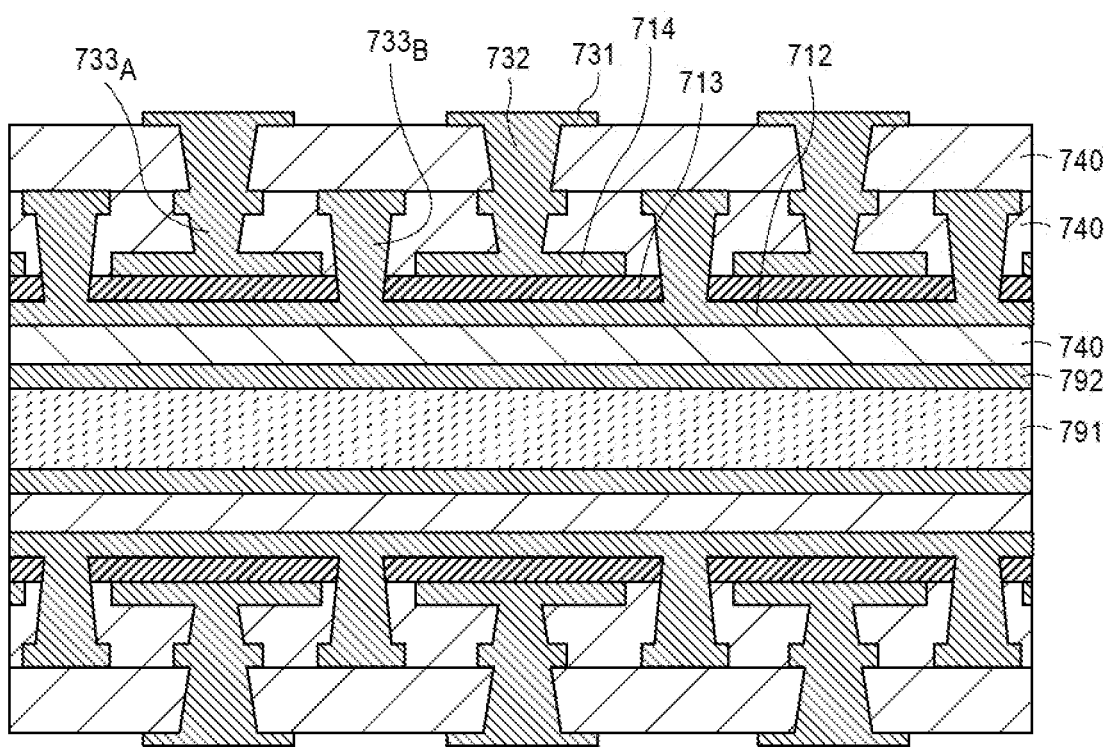
FIG. 7E is a cross-sectional illustration after a build-up layer is formed over the TFC-S, in accordance with an embodiment.

Referring now to FIG. 7E, a cross-sectional illustration after additional build-up layers 740 are formed, in accordance with an embodiment. In an embodiment, the additional build-up layers 740 may be formed with typical lamination processes, and may include conductive traces 731 and vias 732 formed with SAP processes, as is known in the art. While a single additional build-up layer 740 is shown, it is to be appreciated that any number of additional build-up layers 740 may be formed over the second electrode 714, in accordance with an embodiment.

Figure 7F:
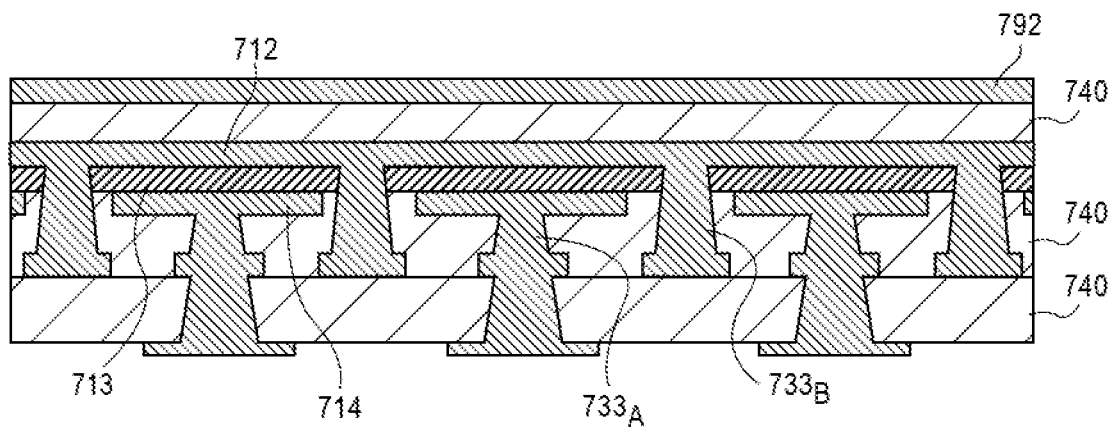
FIG. 7F is a cross-sectional illustration after the core is removed, in accordance with an embodiment.

Referring now to FIG. 7F, a cross-sectional illustration after the dummy core 791 is detached is shown, in accordance with an embodiment. In an embodiment, the dummy core 791 may be removed with any suitable process known in the art.

Figure 7G:
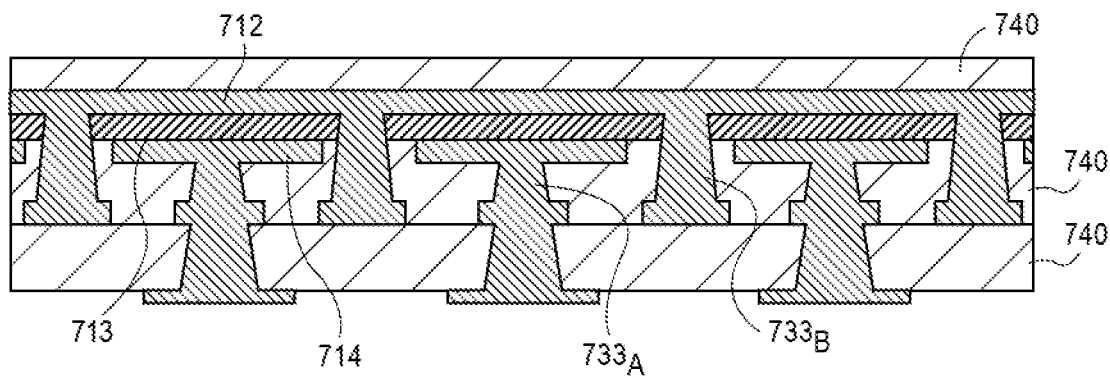
FIG. 7G is a cross-sectional illustration after the copper layer is removed, in accordance with an embodiment.

Referring now to FIG. 7G, a cross-sectional illustration after the copper layer 792 is removed is shown, in accordance with an embodiment. In an embodiment, the copper layer 792 may be removed with a copper etch, as is known in the art.

Figure 7H:
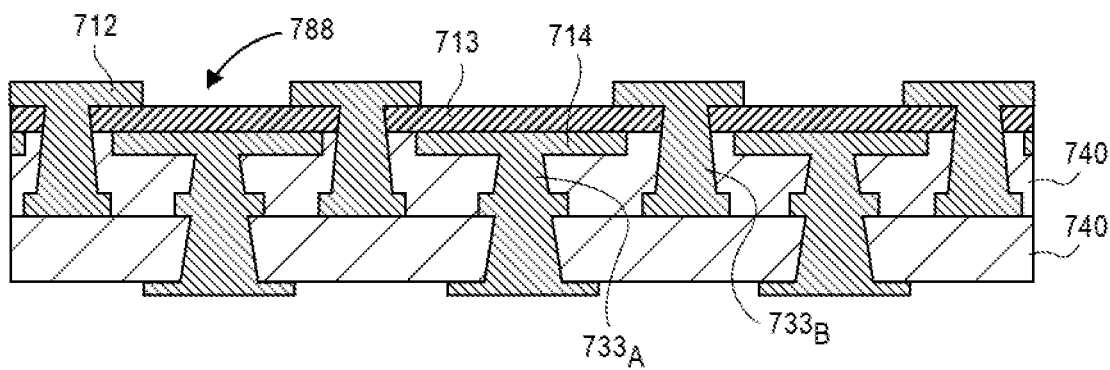
FIG. 7H is a cross-sectional illustration after the first electrode of the TFC-S is patterned, in accordance with an embodiment.

Referring now to FIG. 7H, a cross-sectional illustration after the build-up layer 740 is removed and the first electrode 712 is patterned is shown, in accordance with an embodiment. In an embodiment, the build-up layer 740 may be removed with a laser ablation process. In an embodiment, the first electrode 712 may be patterned to form openings 788 with a lithography process, or the like.

Figure 7I:
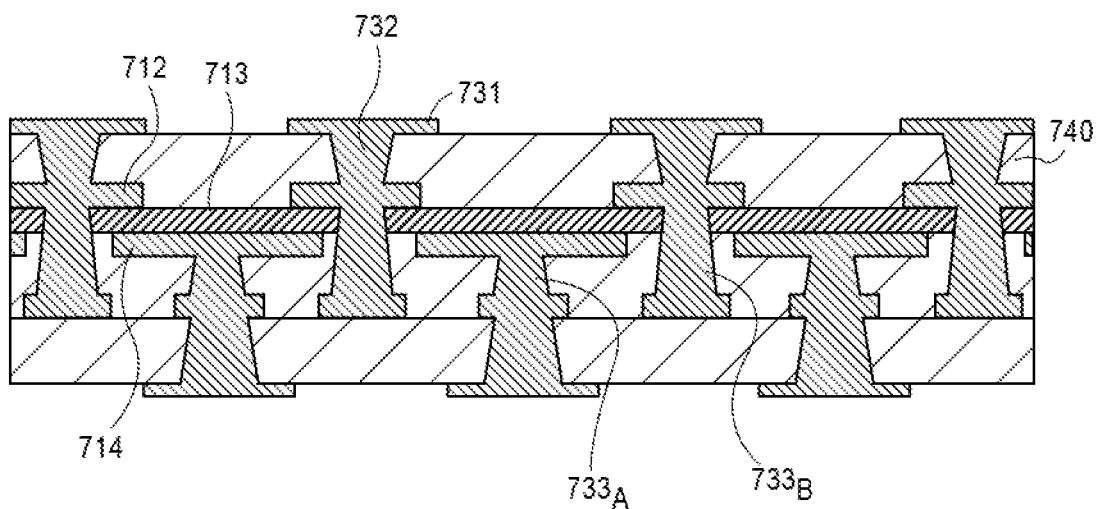
FIG. 7I is a cross-sectional illustration after a build-up layer is formed over the first electrode, in accordance with an embodiment.

Referring now to FIG. 7I, a cross-sectional illustration after a build-up layer 740 and traces 731 and vias 732 are formed over the first electrode 712 is shown, in accordance with an embodiment. In an embodiment, the build-up layer 740 may be disposed over the first electrode 712 with a lamination process, and the traces 731 and vias 732 may be fabricated with SAP processes, or the like.

Figure 7J:
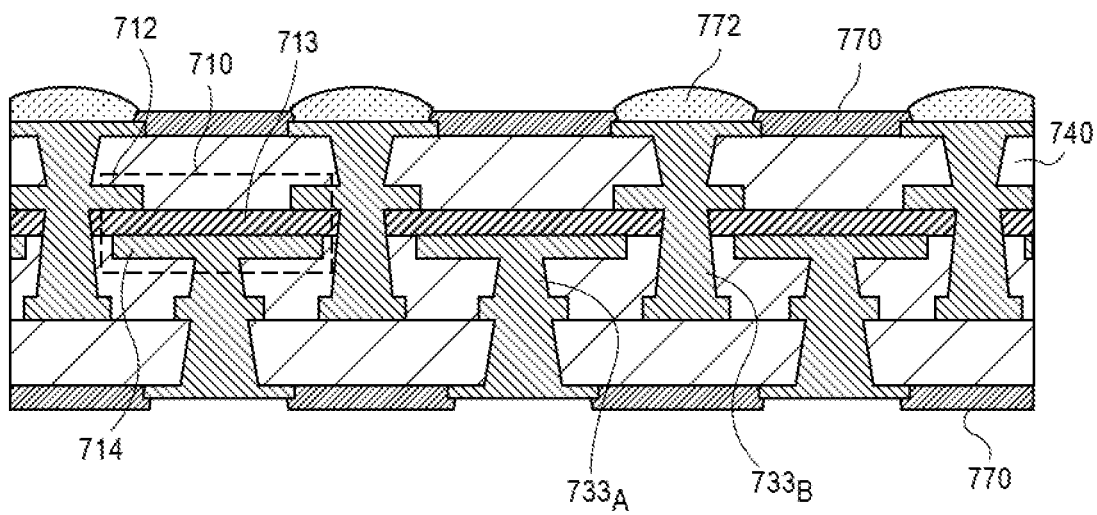
FIG. 7J is a cross-sectional illustration after solder resist is formed over surfaces of the electronics package and first level interconnects are formed, in accordance with an embodiment.

Referring not to FIG. 7J, a cross-sectional illustration after solder resist is deposition and FLI formation is shown, in accordance with an embodiment. In an embodiment, the solder resist 770 may be disposed with a lamination process and the FLIs 772 may be micro balls, or the like.

As illustrated, the capacitor 710 includes portions of the first electrode 712, the second electrode 714, and the high-k dielectric layer 713. While a single portion of the capacitor 710 is highlighted by the dashed lines, it is to be appreciated that the capacitor 710 may span the entire width of the TFC-S used to form the capacitor 710. For example, the capacitor 710 may be a large area capacitor (e.g., having a cross-sectional area greater than 1 mm$^2$). However, embodiments may also include a plurality of smaller capacitors 710 formed from a single TFC-S.

Referring now to FIGS. 8A-8I, a series of cross-sectional illustrations that illustrate a process for forming an coreless electronics package similar to the coreless electronics package 400 described above with respect to FIG. 4 is shown, in accordance with an embodiment.

Figure 8A:
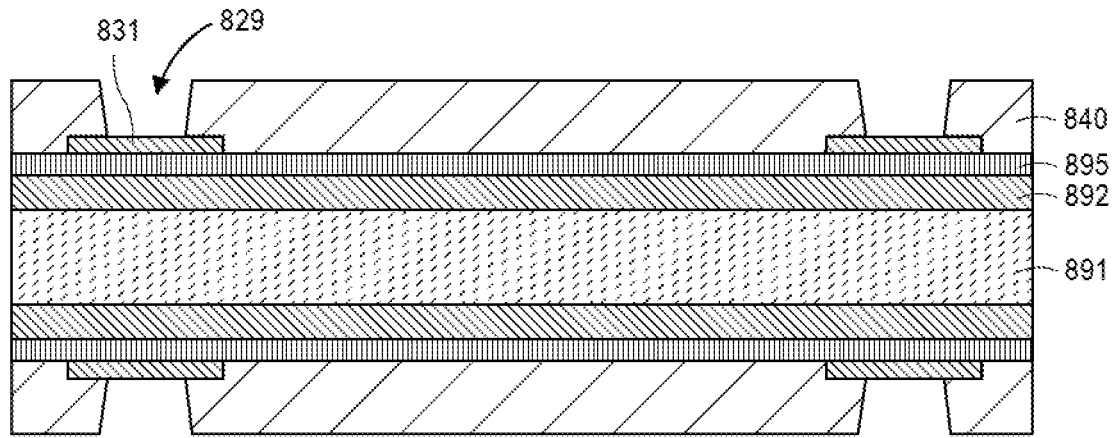
FIG. 8A is a cross-sectional illustration of a core with a laser stop layer, in accordance with an embodiment.

Referring now to FIG. 8A, a cross-sectional illustration of a dummy core 891 is shown, in accordance with an embodiment. In an embodiment, a copper layer 892 and a nickel layer 895 may be formed over the dummy core 891. In an embodiment, traces/pads 831 may be formed over the nickel layer 895 and a build-up layer 840 may be formed over the nickel layer 895. In an embodiment, openings 829 may be formed in the build-up layer 840 to expose the traces/pads 831.

Figure 8B:
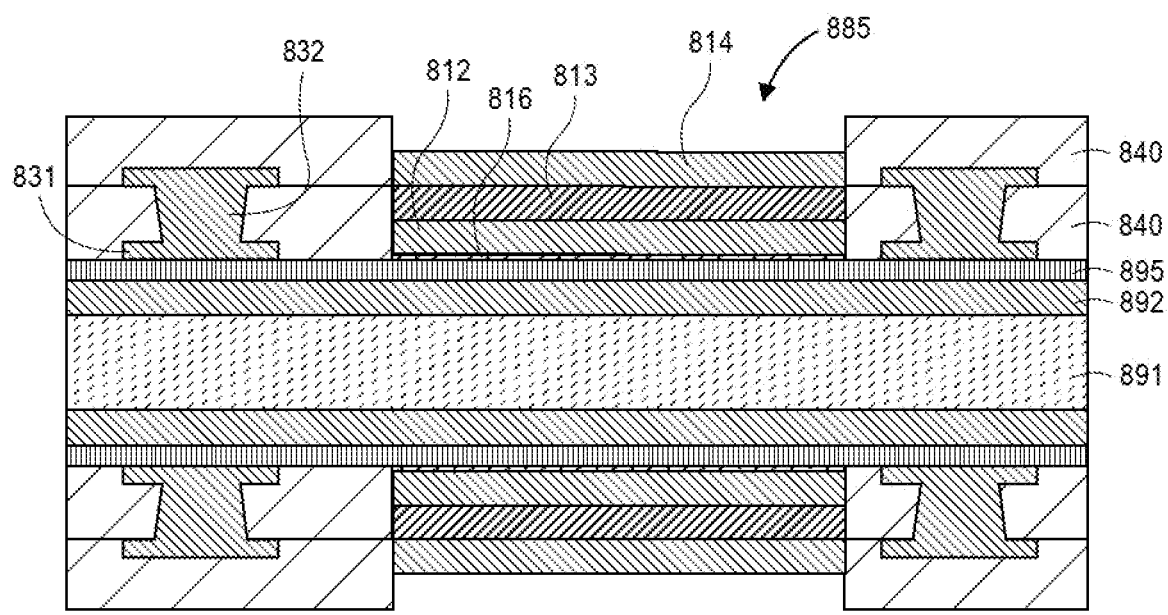
FIG. 8B is a cross-sectional illustration after a cavity is formed in build-up layers over the laser stop layer and a TFC-S is disposed in the cavity, in accordance with an embodiment.

Referring now to FIG. 8B, a cross-sectional illustration after a second build-up layer 840 is formed and a cavity that is filled with a TFC-S is shown, in accordance with an embodiment. In an embodiment, the cavity may be formed with a laser drilling process. In an embodiment, the TFC-S may be placed in the cavity with a pick-and-place process. In an embodiment, the TFC-S may comprise a first electrode 812, a second electrode 814, and a high-k dielectric layer 813 between the first electrode 812 and the second electrode 814. In an embodiment, the TFC-S may also comprise a backside film 816 used to improve the adhesion between the first electrode 812 and the nickel layer 895.

Figure 8C:
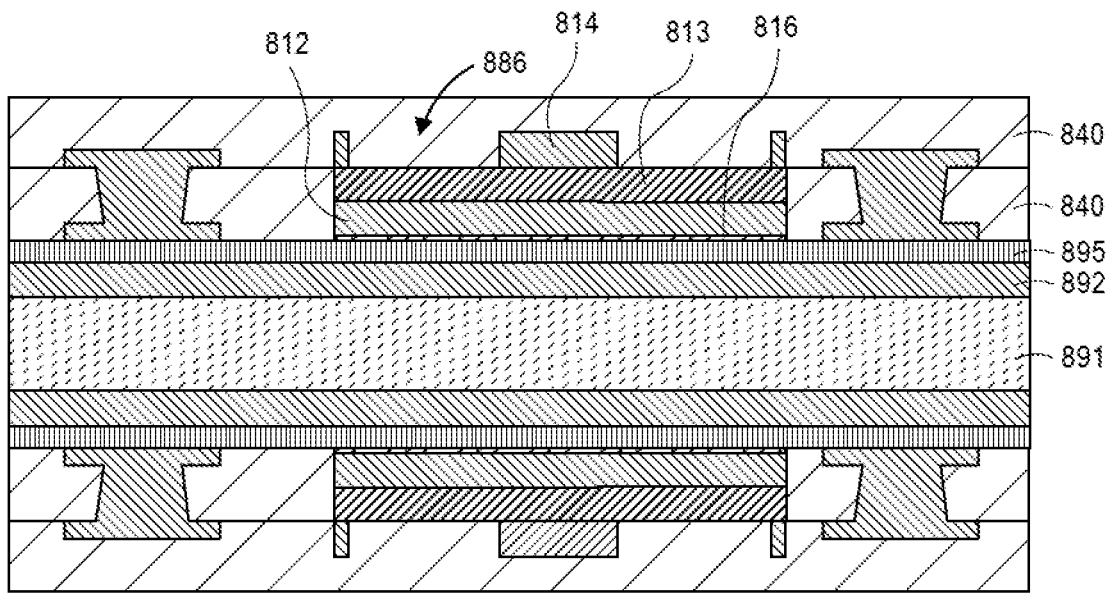
FIG. 8C is a cross-sectional illustration after an electrode of the TFC-S is patterned, in accordance with an embodiment.

Referring now to FIG. 8C, a cross-sectional illustration after the second electrode 814 is patterned and a build-up layer 840 is laminated to fill the cavity is shown, in accordance with an embodiment. In an embodiment, the openings 886 in the second electrode 814 may be patterned with a lithography process, or the like.

Figure 8D:
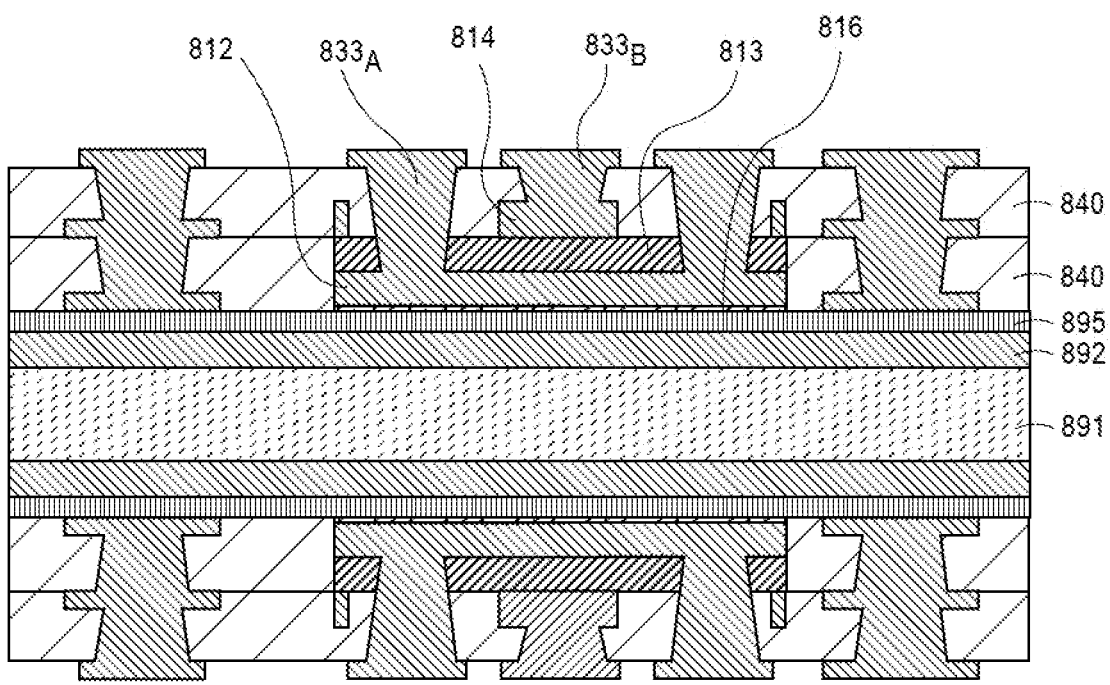
FIG. 8D is a cross-sectional illustration after vias are formed to provide contacts to the first electrode and second electrode of the TFC-S, in accordance with an embodiment.

Referring now to FIG. 8D, a cross-sectional illustration after the vias 833 are formed to provide electrical connections to the first electrode 812 and the second electrode 814 is shown, in accordance with an embodiment. In an embodiment, first vias $833_A$ may provide an electrical connection to the first electrode 812. The first vias $833_A$ may pass through the opening 886 in the second electrode 814 and through the high-k dielectric layer 813. In an embodiment, the second via $833_B$ may provide an electrical connection to the second electrode 814.

Figure 8E:
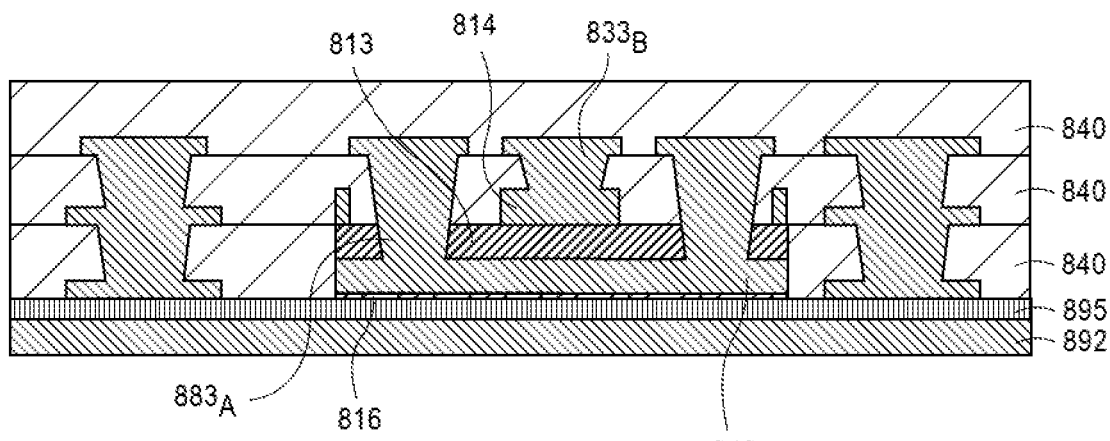
FIG. 8E is a cross-sectional illustration after the core is removed, in accordance with an embodiment.

Referring now to FIG. 8E, a cross-sectional illustration after the dummy core 891 is removed is shown, in accordance with an embodiment. In an embodiment, the dummy core 891 may be removed with any suitable process known in the art.

Figure 8F:
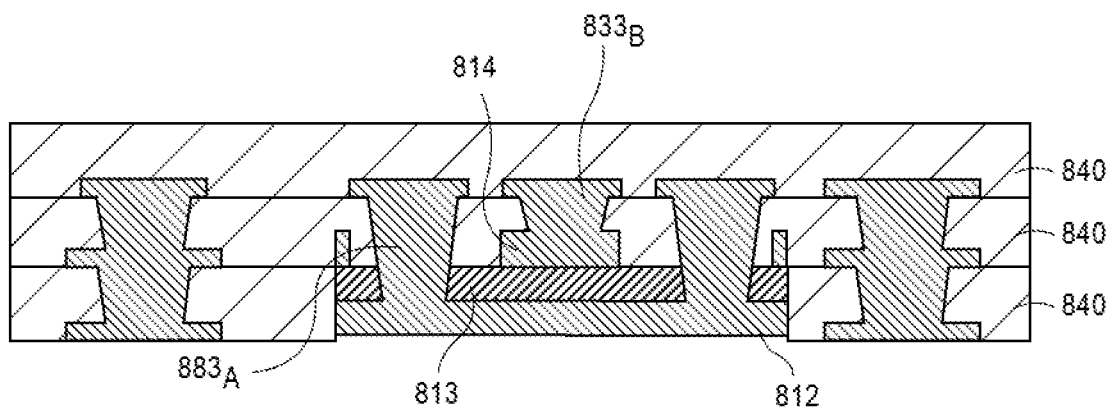
FIG. 8F is a cross-sectional illustration after the copper layer, the laser stop layer, and the backside film of the TFC-S are removed, in accordance with an embodiment.

Referring now to FIG. 8F, a cross-sectional illustration after the copper layer 892 and the nickel layer 895 are removed is shown, in accordance with an embodiment. In an embodiment, the copper layer 892 may be removed with an etching process and the nickel layer 895 may be removed with an etching process. In some embodiments, the front side of the package may be protected by a dry film resist (not shown) during the etching processes. In an embodiment, the backside film 816 may be removed with a suitable process, such as a desmear process.

Figure 8G:
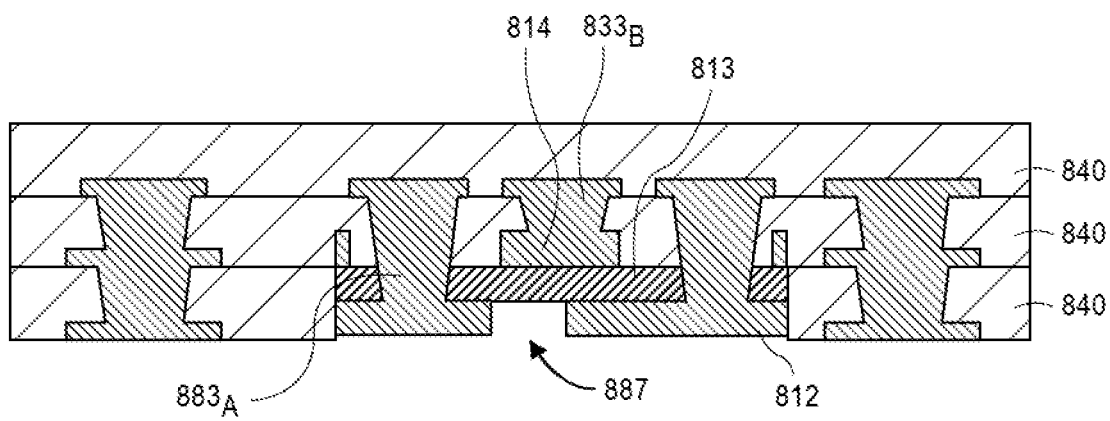
FIG. 8G is a cross-sectional illustration after an electrode of the TFC-S film is patterned, in accordance with an embodiment.

Referring now to FIG. 8G, a cross-sectional illustration after the first electrode 812 is patterned to form openings 887 is shown, in accordance with an embodiment. In an embodiment, the first electrode 812 may be patterned with a lithography process, or the like. In an embodiment, a build-up layer 840 may be laminated over the first electrode 812 to fill the opening 887.

Figure 8H:
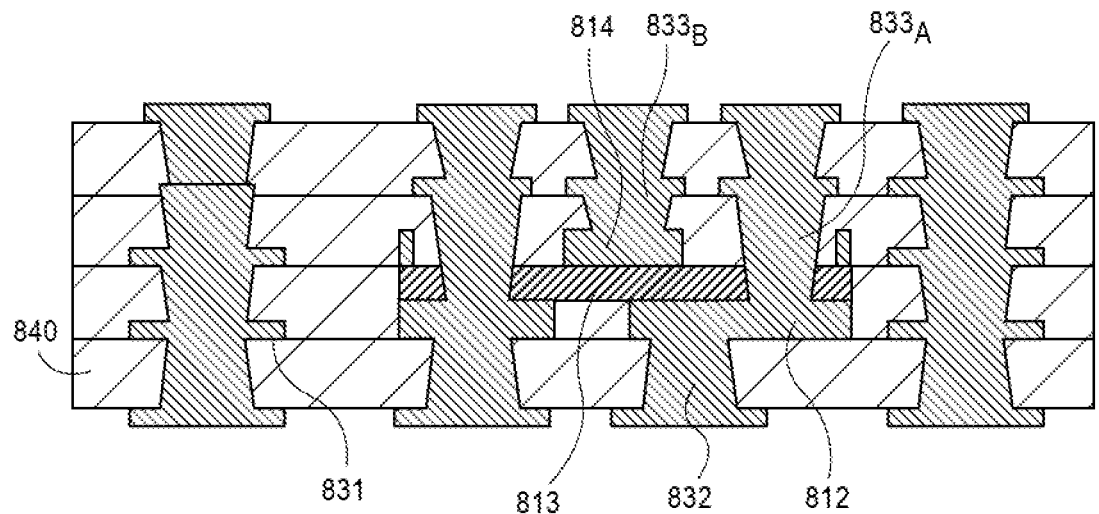
FIG. 8H is a cross-sectional illustration after build-up layers are formed over the TFC-S, in accordance with an embodiment.

Referring now to FIG. 8H, a cross-sectional illustration after a build-up layer 840 and traces 831 and vias 832 are formed over the first electrode 812 is shown, in accordance with an embodiment. In an embodiment, the build-up layer 840 may be disposed over the first electrode 812 with a lamination process, and the traces 831 and vias 832 may be fabricated with SAP processes, or the like.

Figure 8I:
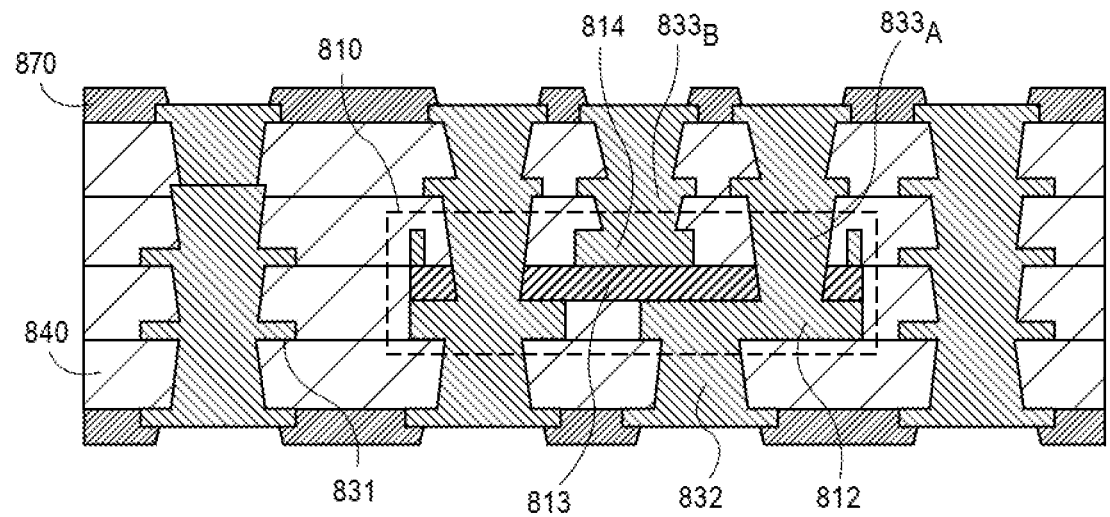
FIG. 8I is a cross-sectional illustration after solder resist layers are formed over the electronics package, in accordance with an embodiment.

Referring now to FIG. 8I, a cross-sectional illustration after the solder resist is deposited is shown, in accordance with an embodiment. In an embodiment, the solder resist 870 may be deposited with a lamination process.

Figure 9:
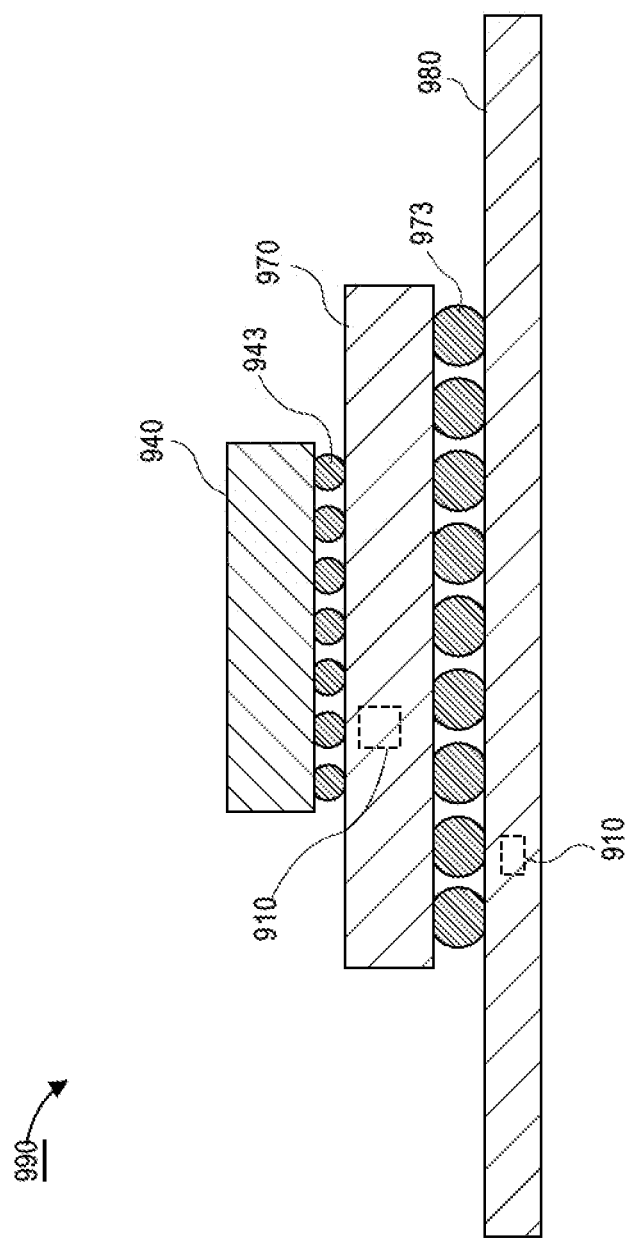
FIG. 9 is a cross-sectional illustration of an electronics package that includes a thin film capacitor formed with a TFC-S, in accordance with an embodiment.

Referring now to FIG. 9, a cross-sectional illustration of a packaged system 990 is shown, in accordance with an embodiment. In an embodiment, the packaged system 990 may include a die 940 electrically coupled to a package substrate 970 with solder bumps 943. In additional embodiments, the die 940 may be electrically coupled to the package substrate 970 with any suitable interconnect architecture, such as wire bonding or the like. The package substrate 970 may be electrically coupled to a board, such as a printed circuit board (PCB) 980 with solder bumps 973 or any other suitable interconnect architecture.

In an embodiment, a capacitor 910 formed with a TFC-S similar to embodiments described above may be integrated into the package substrate 970 or the PCB 980, or the package substrate 970 and the PCB 980. Embodiments include any number of capacitors 910 formed with a TFC-S formed into the package substrate 970 and the PCB 980. For example, a plurality of capacitors 910 formed with a TFC-S may be integrated into the package substrate 970 or the PCB 980, or the package substrate 970 and the PCB 980.

Figure 10:
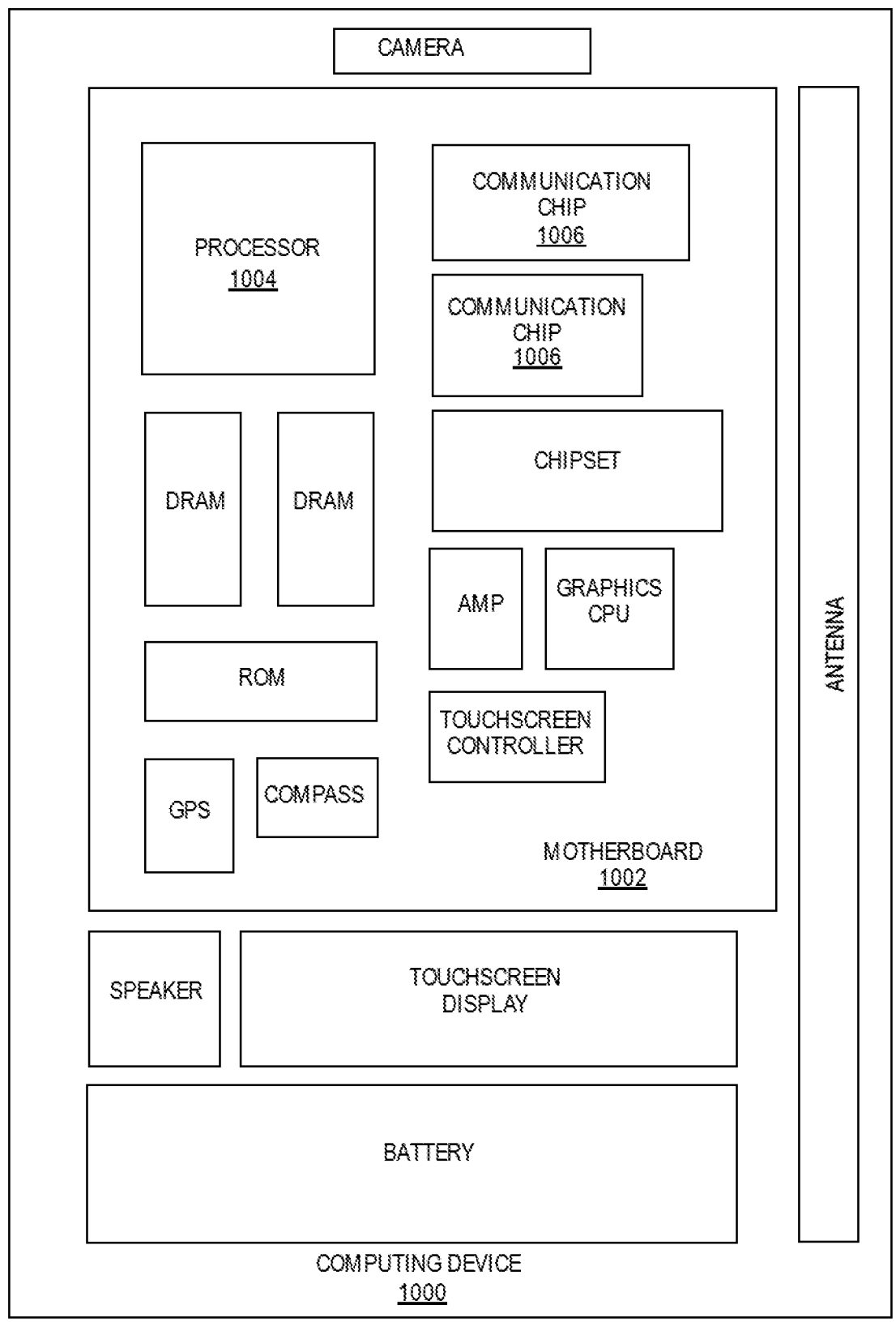
FIG. 10 is a schematic of a computing device built in accordance with an embodiment.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may be communicatively coupled to an organic electronics package that includes thin film capacitors formed with a TFC-Ss, in accordance with embodiments described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be communicatively coupled to an organic electronics package that includes thin film capacitors formed with a TFC-S, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronics package, comprising: a plurality of build-up layers, wherein the build-up layers comprise conductive traces and vias; and a capacitor embedded in the plurality of build-up layers, wherein the capacitor comprises: a first electrode; a high-k dielectric layer over portions of the first electrode; and a second electrode over portions of the high-k dielectric layer.

Example 2: the electronics package of Example 1, further comprising a laser stop trace surrounding a perimeter of the capacitor.

Example 3: the electronics package of Example 1 or Example 2, wherein the capacitor further comprises a backside film contacting a surface of the first electrode.

Example 4: the electronics package of Examples 1-3, wherein the backside film extends through an opening in the first electrode.

Example 5: the electronics package of Examples 1-4, wherein a via passes through the opening in the first electrode, and wherein the via is electrically isolated from the first electrode by the backside film.

Example 6: the electronics package of Examples 1-5, wherein a vertical connection is formed through the capacitor.

Example 7: the electronics package of Examples 1-6, wherein the backside film is formed over a laser stop layer below the capacitor.

Example 8: the electronics package of Examples 1-7, wherein the electronics package is a coreless package.

Example 9: the electronics package of Examples 1-8, wherein the high-k dielectric layer has a dielectric constant that is 100 or greater.

Example 10: the electronics package of Examples 1-9, wherein the high-k dielectric layer is PZT, $BaTiO_3$, $BaHfO3$, or $SrTiO3$.

Example 11: the electronics package of Examples 1-10, wherein a thickness of the high-k dielectric layer is 50 μm or less.

Example 12: the electronics package of Examples 1-11, wherein the first electrode is a different material than the second electrode.

Example 13: the electronics package of Examples 1-12, wherein the first electrode comprises nickel and the second electrode comprises copper.

Example 14: the electronics package of Examples 1-13, wherein the capacitor is embedded in two or more build-up layers.

Example 15: an electronics system, comprising: a package substrate; a die electrically coupled to the package substrate, wherein the package substrate comprises a capacitor embedded within build-up layers of the package substrate in a die shadow region of the package substrate, wherein the capacitor comprises: a first electrode; a high-k dielectric layer over portions of the first electrode; and a second electrode over the high-k dielectric layer.

Example 16: the electronics system of Example 15, wherein the capacitor is a large area capacitor.

Example 17: the electronics system of Example 15 or Example 16, wherein the capacitor has an area that is 1 mm² or greater.

Example 18: the electronics package of Examples 1-17, wherein vertical connections are made through the capacitor.

Example 19: the electronics package of Examples 1-18, wherein the package substrate is a coreless substrate.

Example 20: the electronics package of Examples 1-19, wherein a plurality of capacitors are embedded in the package substrate.

Example 21: the electronics package of Examples 1-20, further comprising a laser stop trace surrounding the capacitor.

Example 22: the electronics package of Examples 1-21, further comprising a laser stop layer below the capacitor.

Example 23: a method of forming a package with an embedded capacitor, comprising: forming a build-up layer; forming a cavity in the build-up layer; and disposing a thin film capacitor sheet into the cavity, wherein the thin film capacitor sheet comprises: a first electrode; a high-k dielectric layer over the first electrode; a second dielectric layer over the first electrode; and a backside film below the first electrode.

Example 24: the method of Example 23, wherein an opening is patterned into the first electrode, and wherein the backside film fills the opening.

Example 25: the method of Example 23 or Example 24, further comprising: forming a vertical connection through the opening in the first electrode.

What is claimed is:

1. An electronics package, comprising:
   a plurality of build-up layers, wherein the build-up layers comprise conductive traces and vias;
   a capacitor embedded in the plurality of build-up layers, wherein the capacitor comprises:
     a first electrode;
     a high-k dielectric layer over portions of the first electrode; and
     a second electrode over portions of the high-k dielectric layer; and
   a laser stop trace surrounding a perimeter of the capacitor.

2. The electronics package of claim 1, wherein the capacitor further comprises a backside film contacting a surface of the first electrode.

3. The electronics package of claim 2, wherein the backside film extends through an opening in the first electrode.

4. The electronics package of claim 3, wherein a via passes through the opening in the first electrode, and wherein the via is electrically isolated from the first electrode by the backside film.

5. The electronics package of claim 3, wherein a vertical connection is formed through the capacitor.

6. The electronics package of claim 2, wherein the backside film is formed over a laser stop layer below the capacitor.

7. The electronics package of claim 1, wherein the electronics package is a coreless package.

8. The electronics package of claim 1, wherein the high-k dielectric layer has a dielectric constant that is 100 or greater.

9. The electronics package of claim 8, wherein the high-k dielectric layer is PZT, $BaTiO_3$, $BaHfO_3$, or $SrTiO_3$.

10. The electronics package of claim 1, wherein a thickness of the high-k dielectric layer is 50 μm or less.

11. The electronics package of claim 1, wherein the first electrode is a different material than the second electrode.

12. The electronics package of claim 11, wherein the first electrode comprises nickel and the second electrode comprises copper.

13. The electronics package of claim 1, wherein the capacitor is embedded in two or more build-up layers.

14. An electronics system, comprising:
   a package substrate;
   a die electrically coupled to the package substrate, wherein the package substrate comprises a capacitor embedded within build-up layers of the package substrate in a die shadow region of the package substrate, wherein the capacitor comprises:
     a first electrode;
     a high-k dielectric layer over portions of the first electrode; and
     a second electrode over the high-k dielectric layer; and
   a laser stop trace surrounding the capacitor.

15. The electronics system of claim 14, wherein the capacitor is a large area capacitor.

16. The electronics system of claim 15, wherein the capacitor has an area that is 1 mm² or greater.

17. The electronics system of claim 15, wherein vertical connections are made through the capacitor.

18. The electronics system of claim 14, wherein the package substrate is a coreless substrate.

19. The electronics system of claim 14, wherein a plurality of capacitors are embedded in the package substrate.

20. The electronics system of claim 14, further comprising a laser stop layer below the capacitor.

21. A method of forming a package with an embedded capacitor, comprising:
   forming a build-up layer;
   forming a cavity in the build-up layer; and
   disposing a thin film capacitor sheet into the cavity, wherein the thin film capacitor sheet comprises:
     a first electrode;
     a high-k dielectric layer over the first electrode;
     a second dielectric layer over the first electrode; and
     a backside film below the first electrode, wherein an opening is patterned into the first electrode, and wherein the backside film fills the opening.

22. The method of claim 21, further comprising:
   forming a vertical connection through the opening in the first electrode.

23. An electronics package, comprising:
   a plurality of build-up layers, wherein the build-up layers comprise conductive traces and vias;
   a capacitor embedded in the plurality of build-up layers, wherein the capacitor comprises:
     a first electrode;
     a high-k dielectric layer over portions of the first electrode;
     a second electrode over portions of the high-k dielectric layer; and
     a backside film contacting a surface of the first electrode, wherein the backside film extends through an opening in the first electrode.

24. An electronics package, comprising:
   a plurality of build-up layers, wherein the build-up layers comprise conductive traces and vias;
   a capacitor embedded in the plurality of build-up layers, wherein the capacitor comprises:
     a first electrode;
     a high-k dielectric layer over portions of the first electrode;
     a second electrode over portions of the high-k dielectric layer; and a backside film contacting a surface of the first electrode, wherein the backside film is formed over a laser stop layer below the capacitor.

* * * * *